(12) United States Patent
Lehtola

(10) Patent No.: US 12,074,576 B2
(45) Date of Patent: Aug. 27, 2024

(54) POWER AMPLIFICATION WITH REDUCED GAIN VARIATION

(71) Applicant: SKYWORKS SOLUTIONS, INC., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 3 days.

(21) Appl. No.: 17/706,854

(22) Filed: Mar. 29, 2022

(65) Prior Publication Data

US 2022/0321074 A1 Oct. 6, 2022

Related U.S. Application Data

(60) Provisional application No. 63/168,870, filed on Mar. 31, 2021.

(51) Int. Cl.
*H03G 3/30* (2006.01)
*H03F 1/02* (2006.01)
(Continued)

(52) U.S. Cl.
CPC ......... *H03G 3/3042* (2013.01); *H03F 1/0211* (2013.01); *H03F 1/302* (2013.01);
(Continued)

(58) Field of Classification Search
CPC ............ H04B 1/04; H04B 1/0458; H04B 2001/0408; H04B 2001/0416; H04B 2001/045; H03G 3/3042; H03G 2201/708; H03G 2201/70; H03F 1/0211; H03F 1/302; H03F 1/56; H03F 3/245; H03F 2200/222;
(Continued)

(56) References Cited

U.S. PATENT DOCUMENTS 3,774,118 A * 11/1973 Van Doorn ............... H04B 3/12
330/95
3,946,279 A * 3/1976 Paice ....................... H02H 3/17
333/213
(Continued)

FOREIGN PATENT DOCUMENTS

CN 111313854 A 6/2020
CN 202210329587.5 3/2022
(Continued)

*Primary Examiner* — James M Perez
(74) *Attorney, Agent, or Firm* — Chang & Hale LLP

(57) ABSTRACT

A power amplifier can include an input stage that includes an amplifying transistor having an input node and an output node, such that a signal at the input node has a first power level and an amplified signal at the output node has a second power level. The power amplifier can further include a bias circuit configured to provide a bias signal to the amplifying transistor, and a feedback circuit that couples the output node of the amplifying transistor to the input node of the amplifying transistor. The feedback circuit can include a resistance and a capacitance arranged in series. The power amplifier can further include a gain compensation circuit implemented relative to the input stage such that the second power level is compensated for a variation in temperature associated with the power amplifier.

12 Claims, 20 Drawing Sheets

(51) Int. Cl.
  *H03F 1/30*  (2006.01)
  *H03F 3/24*  (2006.01)
  *H04B 1/04*  (2006.01)
  H01L 23/66  (2006.01)
  H03F 1/56  (2006.01)

(52) U.S. Cl.
  CPC .............. *H03F 3/245* (2013.01); *H04B 1/04* (2013.01); *H01L 23/66* (2013.01); *H01L 2223/6644* (2013.01); *H03F 1/56* (2013.01); *H03F 2200/222* (2013.01); *H03F 2200/451* (2013.01); *H03G 2201/708* (2013.01)

(58) Field of Classification Search
  CPC ..... H03F 2200/451; H03F 2203/21103–21193
  See application file for complete search history.

(56) References Cited

U.S. PATENT DOCUMENTS

| | | | | |
|---|---|---|---|---|
| 4,028,629 | A * | 6/1977 | Ringland | H03G 3/18 330/302 |
| 4,090,033 | A * | 5/1978 | Silverstein | H04R 27/04 381/86 |
| 4,241,313 | A * | 12/1980 | Takehara | H03F 3/185 330/264 |
| 5,117,203 | A * | 5/1992 | Tennyson | H03F 3/19 330/294 |
| 5,457,427 | A * | 10/1995 | Wong | H03F 1/56 330/306 |
| 5,942,943 | A * | 8/1999 | Matsuno | H03F 3/193 330/306 |
| 6,005,441 | A * | 12/1999 | Kawahara | H03F 1/26 330/307 |
| 6,046,641 | A * | 4/2000 | Chawla | H03F 1/565 330/276 |
| 6,278,328 | B1 * | 8/2001 | Yamamoto | H03F 1/52 330/207 P |
| 6,441,689 | B1 * | 8/2002 | Joseph | H03F 3/191 330/294 |
| 7,253,688 | B2 * | 8/2007 | Bhatia | H03F 3/191 330/311 |
| 7,602,240 | B2 * | 10/2009 | Gao | H03H 7/38 330/98 |
| 8,344,805 | B2 * | 1/2013 | Wang | H03F 3/45645 330/282 |
| 8,422,969 | B2 * | 4/2013 | Wang | H04B 1/04 455/114.3 |
| 9,088,257 | B2 * | 7/2015 | Vice | H03F 1/0205 |
| 9,160,376 | B1 * | 10/2015 | Scuderi | H03F 3/245 |
| 9,385,659 | B2 * | 7/2016 | Vice | H03G 3/20 |
| 9,729,107 | B2 * | 8/2017 | Nobbe | H03F 1/0222 |
| 9,825,616 | B2 * | 11/2017 | Vice | H03F 3/21 |
| 9,831,841 | B2 * | 11/2017 | Wu | H03F 1/02 |
| 10,044,330 | B2 * | 8/2018 | Ishihara | H03F 3/191 |
| 10,256,778 | B2 * | 4/2019 | Ishihara | H03F 3/191 |
| 10,476,454 | B2 * | 11/2019 | Ishihara | H03F 1/34 |
| 10,491,163 | B1 * | 11/2019 | Mokalla | H03F 1/223 |
| 10,560,059 | B2 * | 2/2020 | Shounai | H03F 3/213 |
| 10,826,453 | B2 * | 11/2020 | Honda | H03G 3/3042 |
| 10,833,636 | B2 * | 11/2020 | Bai | H03F 3/19 |
| 10,855,231 | B2 * | 12/2020 | Su | H03F 3/245 |
| 11,177,781 | B2 * | 11/2021 | Zhao | H03F 3/213 |
| 11,323,074 | B2 * | 5/2022 | Zhao | H03F 3/24 |
| 11,463,060 | B2 * | 10/2022 | Honda | H03G 3/3042 |
| 11,777,460 | B2 * | 10/2023 | Wu | H03F 1/0211 330/253 |
| 2006/0114059 | A1 * | 6/2006 | Wiegner | H03F 3/1935 330/86 |
| 2006/0255861 | A1 * | 11/2006 | Ono | H03F 1/565 330/296 |
| 2014/0266456 | A1 * | 9/2014 | Vice | H03G 1/0094 330/291 |
| 2015/0188500 | A1 * | 7/2015 | Kang | H03F 1/223 330/293 |
| 2015/0270806 | A1 * | 9/2015 | Wagh | H03F 3/45188 330/296 |
| 2015/0311866 | A1 * | 10/2015 | Vice | H03G 3/3042 330/251 |
| 2016/0056813 | A1 * | 2/2016 | Vice | H03K 17/602 330/297 |
| 2016/0072485 | A1 * | 3/2016 | Vice | H03G 3/3042 330/296 |
| 2016/0190996 | A1 * | 6/2016 | Searle | H03F 3/211 330/295 |
| 2016/0276983 | A1 * | 9/2016 | Vaillancourt | H03F 3/72 |
| 2017/0133989 | A1 * | 5/2017 | Dykstra | H03F 1/223 |
| 2018/0083581 | A1 * | 3/2018 | Ishihara | H03F 3/21 |
| 2018/0302045 | A1 * | 10/2018 | Ishihara | H03F 3/21 |
| 2018/0316311 | A1 * | 11/2018 | Gebeyehu | H03F 1/0227 |
| 2019/0103846 | A1 * | 4/2019 | Honda | H03F 3/195 |
| 2019/0181816 | A1 * | 6/2019 | Ishihara | H03F 1/34 |
| 2020/0007088 | A1 * | 1/2020 | Ranta | H03F 1/301 |
| 2020/0177142 | A1 * | 6/2020 | Zhao | H03F 1/34 |
| 2020/0220504 | A1 * | 7/2020 | Zhao | H03F 1/34 |
| 2021/0013855 | A1 * | 1/2021 | Honda | H03F 1/0216 |
| 2021/0265965 | A1 * | 8/2021 | Peng | H04B 1/406 |
| 2022/0278661 | A1 * | 9/2022 | Wu | H03F 3/45273 |
| 2022/0321074 | A1 * | 10/2022 | Lehtola | H04B 1/04 |
| 2022/0393650 | A1 * | 12/2022 | Ayranci | H03F 1/223 |
| 2024/0007058 | A1 * | 1/2024 | Ayranci | H03H 7/00 |
| 2024/0113663 | A1 * | 4/2024 | Imai | H03F 1/0288 |

FOREIGN PATENT DOCUMENTS

| | | |
|---|---|---|
| JP | 2022-051403 | 3/2002 |
| KR | 10-2022-0039651 | 3/2022 |
| SG | 10202203184Q | 3/2022 |
| TW | 11111122223 | 3/2022 |

* cited by examiner

POWER AMPLIFICATION WITH REDUCED GAIN VARIATION

CROSS-REFERENCE TO RELATED APPLICATION(S)

This application claims priority to U.S. Provisional Application No. 63/168,870 filed Mar. 31, 2021, entitled POWER AMPLIFICATION WITH REDUCED GAIN VARIATION, the disclosure of which is hereby expressly incorporated by reference herein in its respective entirety.

BACKGROUND

Field

The present disclosure relates to power amplification of signals such as radio-frequency (RF) signals.

Description of the Related Art

In many radio-frequency (RF) applications, it is desirable to amplify a signal. In an example context of a transmit operation, such amplification of signal can provide power amplification of the signal, and the power-amplified signal can be transmitted from an RF device such as a wireless device.

SUMMARY

In accordance with some implementations, the present disclosure relates to a power amplifier that includes an input stage that includes an amplifying transistor having an input node and an output node, such that a signal at the input node has a first power level and an amplified signal at the output node has a second power level. The power amplifier further includes a bias circuit configured to provide a bias signal to the amplifying transistor, and a feedback circuit that couples the output node of the amplifying transistor to the input node of the amplifying transistor. The feedback circuit includes a resistance and a capacitance arranged in series. The power amplifier further includes a gain compensation circuit implemented relative to the input stage such that the second power level is compensated for a variation in temperature associated with the power amplifier.

In some embodiments, the gain compensation circuit can be implemented along an input path to the input node of the amplifying transistor, such that the gain compensation circuit adjusts the first power level of the signal provided to the input node of the amplifying transistor based on the variation in temperature. The gain compensation circuit can include a variable attenuator configured to provide different attenuation values based on a control signal that depends on the variation in temperature.

In some embodiments, the gain compensation circuit can be implemented along an output path from the input node of the amplifying transistor, such that the gain compensation circuit adjusts the second power level of the amplified signal from the output node of the amplifying transistor based on the variation in temperature. The gain compensation circuit can include a variable attenuator configured to provide different attenuation values based on a control signal that depends on the variation in temperature.

In some embodiments, the gain compensation circuit can be implemented along the feedback circuit to adjust a gain of the input stage based on the variation in temperature. The gain compensation circuit can include a variable resistance circuit configured to provide a variable resistance value based on the variation in temperature. The variable resistance value can provide some or all of the resistance of the feedback circuit. The variable resistance circuit can be configured to provide a plurality of discrete values based on the variation in temperature.

In some embodiments, the variable resistance circuit can include a plurality of resistances arranged to be electrically parallel, with at least one of the plurality of resistances being configured to be switchable.

In some embodiments, the variable resistance circuit can be configured to provide analog values based on the variation in temperature. The variable resistance circuit can include a diode resistance circuit controlled by a control signal that depends on the variation in temperature. The variable resistance circuit can include a plurality of transistors arranged in series and controlled by a control voltage to provide the variable resistance value based on the variation in temperature. The control voltage being provided to the variable resistance circuit can depend on the variation in temperature. The plurality of transistors arranged in series can include a plurality of BiHEMT transistors.

In some embodiments, the gain compensation circuit can include a variable capacitance circuit configured to provide a variable capacitance value based on the variation in temperature. The variable capacitance value can provide some or all of the capacitance of the feedback circuit. The variable capacitance circuit can be configured to provide a plurality of discrete values based on the variation in temperature. The variable capacitance circuit can include a plurality of capacitances arranged to be electrically parallel, with at least one of the plurality of capacitances being configured to be switchable.

In some embodiments, the variable capacitance circuit can be configured to provide analog values based on the variation in temperature. The variable capacitance circuit can include a diode capacitance circuit controlled by a control signal that depends on the variation in temperature. The variable capacitance circuit can include a plurality of diodes and controlled by a control voltage to provide the variable capacitance value based on the variation in temperature. The control voltage being provided to the variable capacitance circuit can depend on the variation in temperature. The plurality of diodes can include a first diode and a second diode arranged such that an anode of the first diode is on an input side of the variable capacitance circuit, and anode of the second diode is on an output side of the variable capacitance circuit, and cathodes of the first and second diodes are coupled to each other, with the control voltage being provided to a node between the cathodes of the first and second diodes.

In some embodiments, the power amplifier can further include a second stage configured to further amplify the amplified signal from the input stage. In some embodiments, the second stage can include first and second amplifying transistors arranged in a cascode configuration.

In some embodiments, the bias circuit can be configured such that the bias signal provided to the amplifying transistor depends on the variation in temperature. The bias circuit can be configured to utilize a reference current to generate the bias signal, with the reference current depending on the variation in temperature.

In some teachings, the present disclosure relates to a semiconductor die that includes a substrate and a power amplifier implemented on the substrate. The power amplifier includes an input stage that includes an amplifying transistor having an input node and an output node, such that a signal at the input node has a first power level and an amplified signal at the output node has a second power level. The power amplifier further includes a feedback circuit that couples the output node of the amplifying transistor to the input node of the amplifying transistor. The feedback circuit includes a resistance and a capacitance arranged in series. The power amplifier further includes a gain compensation circuit implemented relative to the input stage such that the second power level is compensated for a variation in temperature associated with the power amplifier.

In some embodiments, the power amplifier can further include a bias circuit configured to provide a bias signal to the amplifying transistor.

In some implementations, the present disclosure relates to a packaged module that includes a packaging substrate and a semiconductor die mounted on the packaging substrate and including a power amplifier. The power amplifier includes an input stage that includes an amplifying transistor having an input node and an output node, such that a signal at the input node has a first power level and an amplified signal at the output node has a second power level. The power amplifier further includes a feedback circuit that couples the output node of the amplifying transistor to the input node of the amplifying transistor. The feedback circuit includes a resistance and a capacitance arranged in series. The power amplifier further includes a gain compensation circuit implemented relative to the input stage such that the second power level is compensated for a variation in temperature associated with the power amplifier.

In some embodiments, the packaged module can further include a bias circuit configured to provide a bias signal to the amplifying transistor. In some embodiments, the bias circuit can be implemented on the semiconductor die.

In some embodiments, the packaged module can further include one or more passive devices with each generating at least some heat during operation of the power amplifier. The variation in temperature can result from either or both of operation of the power amplifier and use of the one or more passive devices.

In some implementations, the present disclosure relates to a wireless device that includes a transceiver configured to generate a signal, and a power amplifier configured to amplify the signal. The power amplifier includes an input stage that includes an amplifying transistor having an input node and an output node, such that a signal at the input node has a first power level and an amplified signal at the output node has a second power level. The power amplifier further includes a feedback circuit that couples the output node of the amplifying transistor to the input node of the amplifying transistor. The feedback circuit includes a resistance and a capacitance arranged in series. The power amplifier further includes a gain compensation circuit implemented relative to the input stage such that the second power level is compensated for a variation in temperature associated with the power amplifier. The wireless device further includes an antenna in communication with the power amplifier and configured to support transmission of the amplified signal provided by the power amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In many electronic applications, such as in radio-frequency (RF) applications, an amplifier such as a power amplifier is implemented in a semiconductor die, and such a die is often mounted on a module such as a power amplifier module (PAM) or a front end module (FEM). Such a power amplifier can experience gain variation over a range of temperature due to a number of factors. For example, beta parameter of a power amplifier transistor can degrade as temperature increases, thereby resulting in a reduced gain at higher temperature. In another example, equivalent series resistance (ESR) of a power amplifier can increase (or quality factor Q can decrease) as temperature increases in passive devices such as matching and/or filter inductors and capacitors, thereby resulting an increased loss at higher temperature. In yet another example, on-resistance of an RF switch associated with a power amplifier can increase as temperature increases, thereby resulting in an increased loss at higher temperature. In yet another example, RF filter and/or duplexer loss (e.g., SAW, F-BAR, BAW filters and/or related devices) can increase as temperature increases, thereby resulting in an increased loss at higher temperature.

Each of the foregoing example factors can contribute to a module's gain variation over a range of temperature. Such a gain variation places an extra burden on a transceiver to deliver high power into a power amplifier when the gain decreases (e.g. at high temperature).

In some situations, an output power of a transceiver or an input power of a power amplifier can be increased when the power amplifier's gain decreases due to an increase in temperature. However, such a solution typically requires more calibration and/or increased complexity due to a wide power amplifier gain variation over temperature. Further, the transceiver also needs a higher output power requirement to ensure that adequate power is delivered to an antenna over a range of temperature.

In some situations, a temperature compensation circuit can be implemented to provides an appropriate bias current to a power amplifier. However, such a solution can result in degradation of linearity over a range of temperature.

Figure 1:
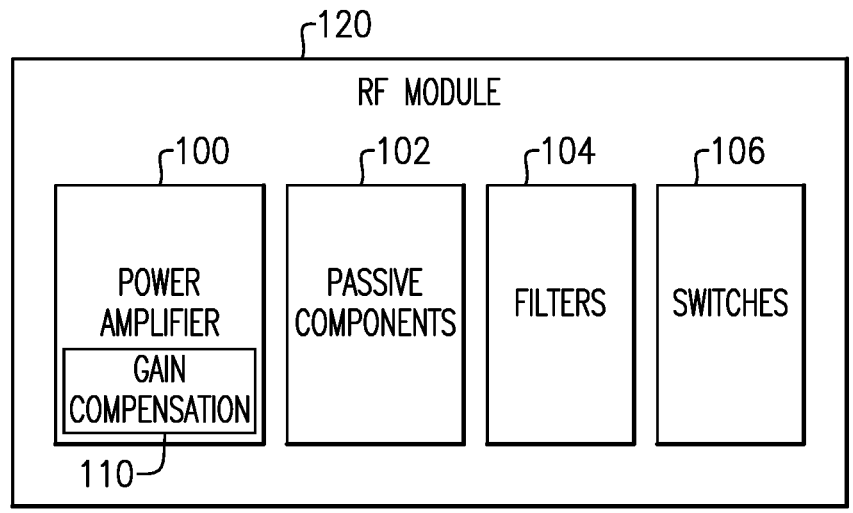
FIG. 1 depicts a block diagram of a radio-frequency (RF) module having a power amplifier that includes and/or be coupled to a gain compensation circuit.

FIG. 1 depicts a block diagram of a radio-frequency (RF) module 120 that includes a power amplifier 100. In some embodiments, such a power amplifier can include and/or be coupled to a gain compensation circuit 110 having one or more features as described herein. Examples of such a gain compensation circuit are described herein in greater detail.

As shown in FIG. 1, the RF module 120 can further include one or more passive components 102, one or more filters 104, and one or more switches 106. As described herein, some or all of such components can increase the temperature of the module 120 during operation of the module 120. Accordingly, such an increase in temperature can result in a change in gain (e.g., decrease in gain) of the power amplifier 100.

Figure 2:
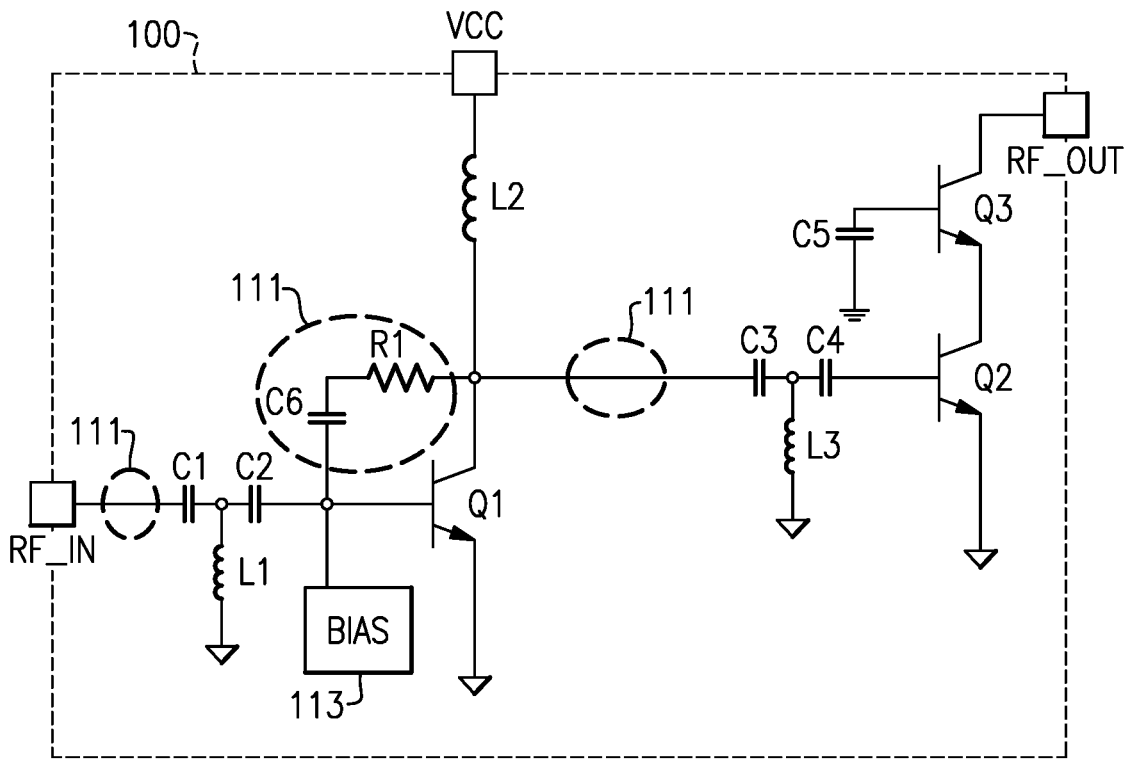
FIG. 2 shows an example of a power amplifier that can include and/or be provided with a gain compensation circuit.

FIG. 2 shows an example of a power amplifier 100 that can include and/or be provided with a gain compensation circuit (110 in FIG. 1). The example power amplifier 100 is shown to include an input node RF_in for receiving a signal to be amplified. Such an input node is shown to be coupled through an input path to an input of an amplifying transistor Q1 of a first stage. A partially amplified signal from an output of Q1 is shown to be coupled through an interstage path to an input of an amplifying transistor Q2 of a second stage. The transistor Q2 is shown to be coupled to another amplifying transistor Q3 in a cascode configuration, such that an output of the transistor Q3 is coupled to an output node RF_out of the power amplifier 100.

In the example of FIG. 2, each of the amplifiers Q1, Q2, Q3 is shown to be implemented as a bipolar-junction transistor having a base, an emitter and a collector. Thus, Q1 is shown to have its base as an input, its collector as an output, and its emitter coupled to ground. Q2 shown to be implemented as common emitter device coupled to Q3 implemented as a common base device. Thus, Q2 has its base as an input (coupled to the output of Q1), its collector as an output, and its emitter coupled to ground. Q3 has its emitter is as in input (coupled to the output (collector) of Q2), its collector as an output (coupled to the power amplifier output RF_out), and its base coupled to ground through a capacitance C5.

In the example of FIG. 2, the transistor Q1 is shown to be provided with a supply voltage VCC to its collector through a choke inductance L2. It will be understood that Q3 can also be provided with a supply voltage through its collector. Also, it will be understood that each of the transistors Q1, Q2, Q3 can be provided with a bias signal for operation through its base.

In the example of FIG. 2, an input matching circuit is shown to be provided as, for example, a T-circuit having capacitances C1, C2 in series, and an inductance L1 that couples a node between C1 and C2 to ground. Capacitance values of C1 and C2 may or may not be the same. Similarly, an interstage matching circuit is shown to be provided as, for example, a T-circuit having capacitances C3, C4 in series, and an inductance L3 that couples a node between C3 and C4 to ground. Capacitance values of C3 and C4 may or may not be the same. It will be understood that a power amplifier having one or more features as described herein may or may not have either or both of matching circuits, and that such matching circuit(s) can also be implemented in other forms (e.g., other than a T-circuit).

In the example of FIG. 2, a feedback circuit is shown to couple the output of Q1 to the input of Q1. In some embodiments, such a feedback circuit can include a resistance R1 and a capacitance C6 arranged in series.

FIG. 2 shows that in some embodiments, a gain compensation circuit (110 in FIG. 1) can be implemented at one or more portions of the power amplifier 100. For example, a gain compensation circuit can be implemented along the input path of the transistor Q1, and such an implementation is indicated as 111 along the input path (e.g., between the input node RF_in and the input matching circuit). In another example, a gain compensation circuit can be implemented along the interstage path between Q1 and Q2, and such an implementation is indicated as 111 along the interstage path (e.g., between the output of Q1 and the interstage matching circuit). In yet another example, a gain compensation circuit can be implemented along the feedback circuit for Q1, and such an implementation is indicated as 111 along the feedback circuit between the output of Q1 and the input of Q1.

In the example of FIG. 2, the power amplifier 100 can include a biasing circuit 113 configured to provide a bias signal to the amplifying transistor Q1. In some embodiments, such a bias signal can be generated based on a reference current provided in, or to, the biasing circuit 113. In some embodiments, such a reference current can be provided based at least in part on temperature of a module associate with the power amplifier 100.

In some embodiments, gain compensation for the power amplifier 100 can be based on a gain compensation circuit at an implementation location 111 by itself or in combination with temperature-based compensation of the bias signal provided by the biasing circuit 113.

Figure 3:
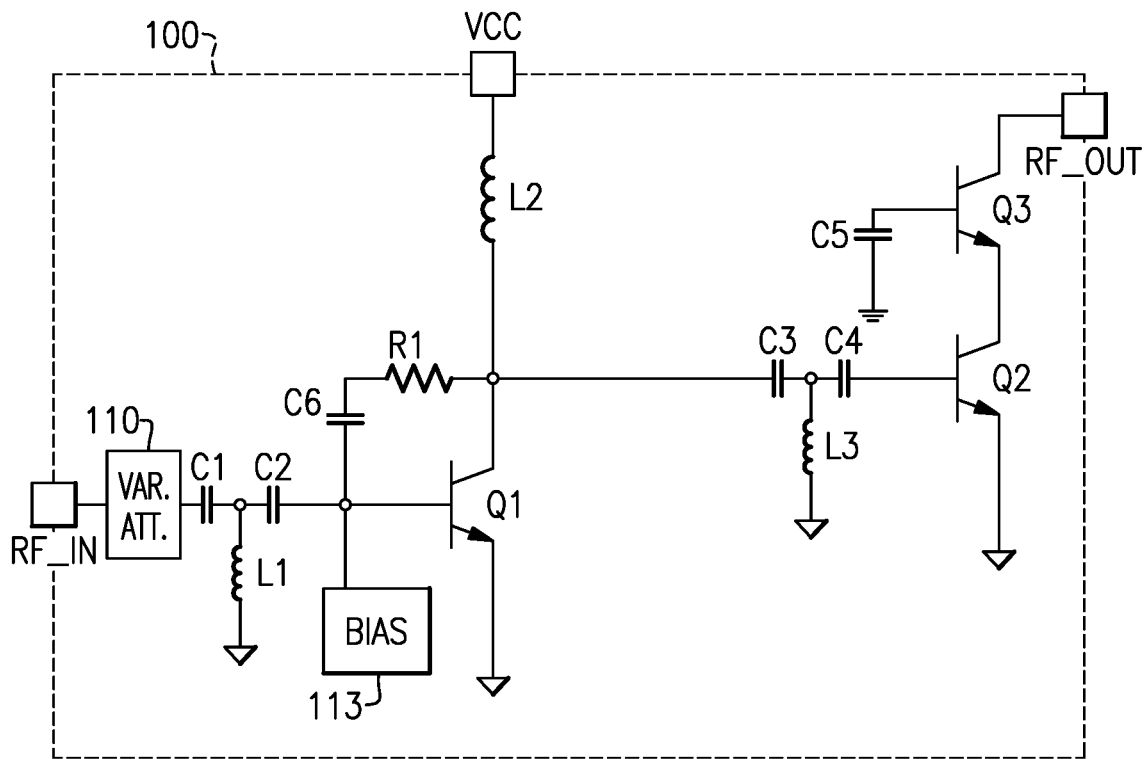
FIG. 3 shows that in some embodiments, the power amplifier of FIG. 2 can include a gain compensation circuit implemented along an input path of a transistor.

FIG. 3 shows that in some embodiments, the power amplifier 100 of FIG. 2 can include a gain compensation circuit 110 implemented along the input path of the transistor Q1. In some embodiments, such a gain compensation circuit can include, for example, a variable attenuator 110 configured to provide variable attenuation of the input signal received at the input node RF_in, such that the input signal provided to the input of Q1 is attenuated by different amounts depending on temperature of a module associate with the power amplifier 100.

It is noted that in the example of FIG. 3, the variable attenuator 110 can be implemented in situations where design considerations such as little or no impact on driver stage load line, little or no impact on power added efficiency, and lower input power are desired or present, and where possible degradation of noise figure is or may be acceptable.

Figure 7:
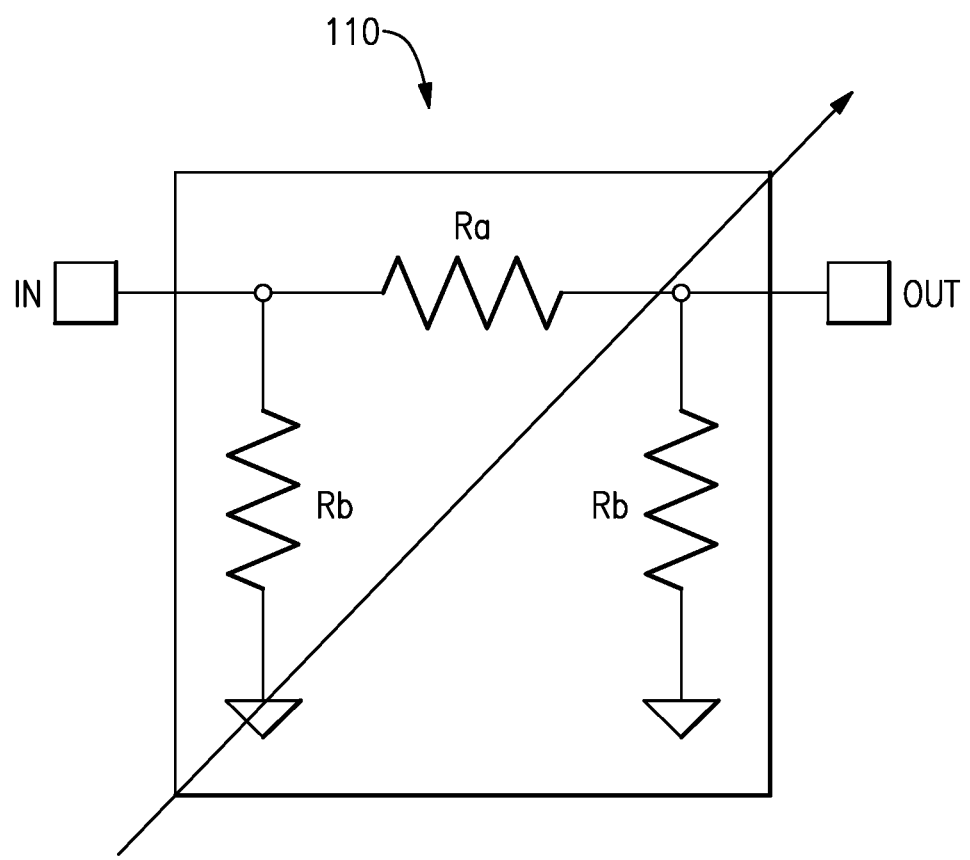
FIG. 7 shows an example of a variable attenuator that can be utilized for the gain compensation circuit in each of the example power amplifiers of FIGS. 3 and 4.

FIG. 7 shows an example of a variable attenuator 110 that can be utilized for the variable attenuator 110 associated with the power amplifier 100 of FIG. 3. It will be understood that the variable attenuator 110 of FIG. 3 can also be implemented with different configurations than the example of FIG. 7.

Figure 4:
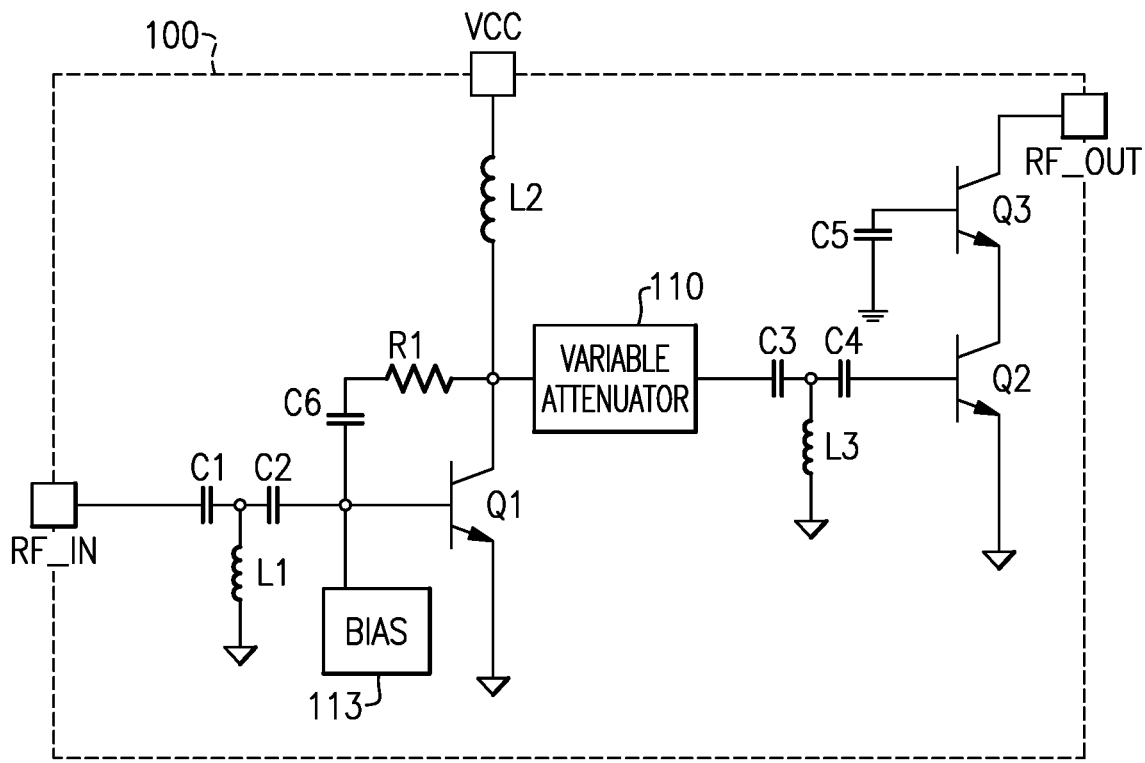
FIG. 4 shows that in some embodiments, the power amplifier of FIG. 2 can include a gain compensation circuit implemented along an interstage path.

FIG. 4 shows that in some embodiments, the power amplifier 100 of FIG. 2 can include a gain compensation circuit 110 implemented along the interstage path between Q1 and Q2. In some embodiments, such a gain compensation circuit can include, for example, a variable attenuator configured to provide variable attenuation of the partially amplified signal provided by Q1, such that the input signal provided to the input of Q2 is attenuated by different amounts depending on temperature of a module associate with the power amplifier 100.

It is noted that in the example of FIG. 4, the variable attenuator 110 can be implemented in situations where a small impact on noise figure is desired or present, and where factors such as an increased supply current (associated with VCC), a pull on driver stage load line, and higher signal power are acceptable or present.

FIG. 7 shows an example of a variable attenuator 110 that can be utilized for the variable attenuator 110 associated with the power amplifier 100 of FIG. 4. It will be understood that the variable attenuator 110 of FIG. 4 can also be implemented with different configurations than the example of FIG. 7. It will also be understood that the attenuators of FIGS. 3 and 4 may or may not be configured in a similar manner.

Figure 5:
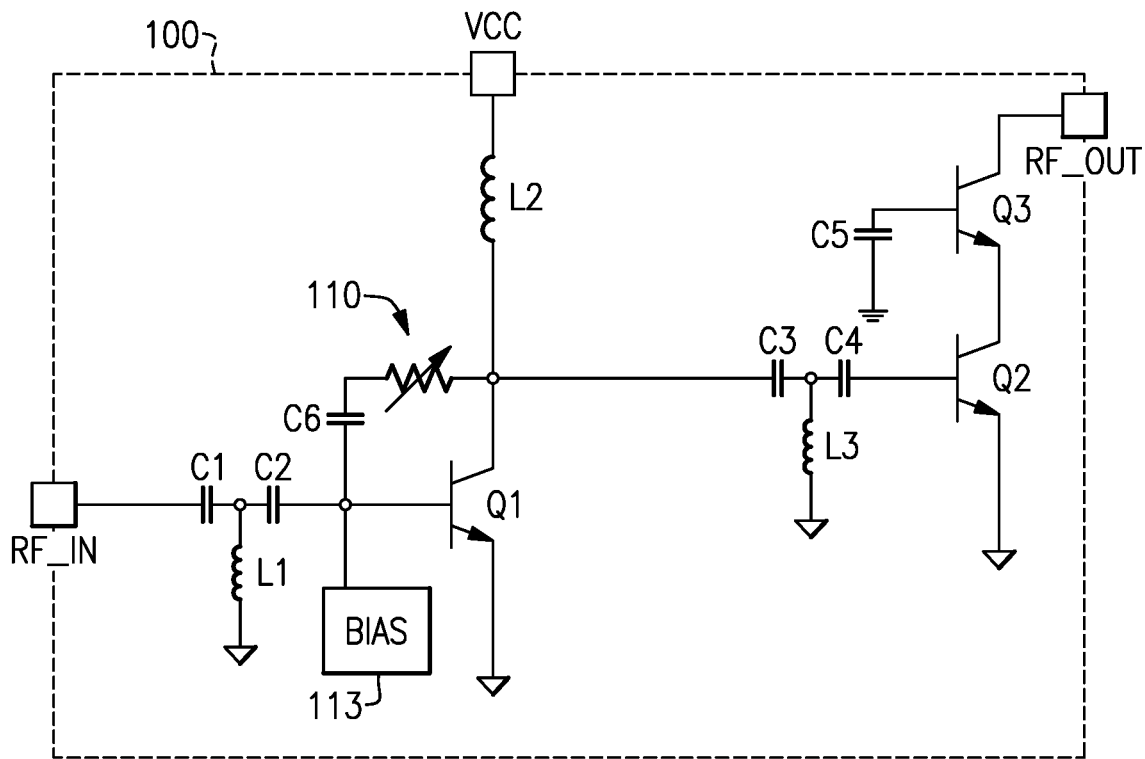
FIG. 5 shows that in some embodiments, the power amplifier of FIG. 2 can include a gain compensation circuit implemented along a feedback circuit that couples an output of a transistor to an input of the transistor.

FIG. 5 shows that in some embodiments, the power amplifier 100 of FIG. 2 can include a gain compensation circuit 110 implemented along the feedback circuit that couples the output of Q1 to the input of Q1. In the example of FIG. 5, the gain compensation circuit 110 is shown to include a variable resistance configured to provide variable resistance in place of or in addition to the resistance R1 described herein in reference to FIG. 2. Accordingly, in some embodiments, resistance associated with the feedback circuit can be based on temperature of a module associate with the power amplifier 100.

Figure 8A:
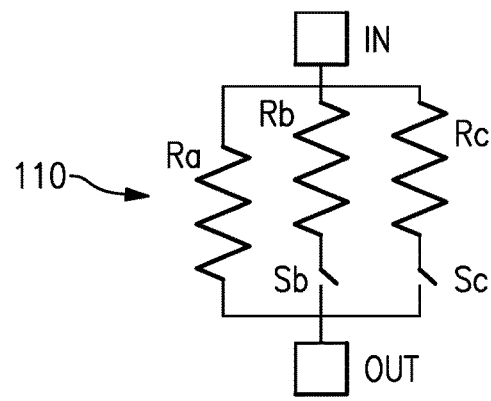
FIGS. 8A to 8C show examples of a variable resistance circuit that can be utilized for the gain compensation circuit in the example power amplifier of FIG. 5.
Figure 8B:
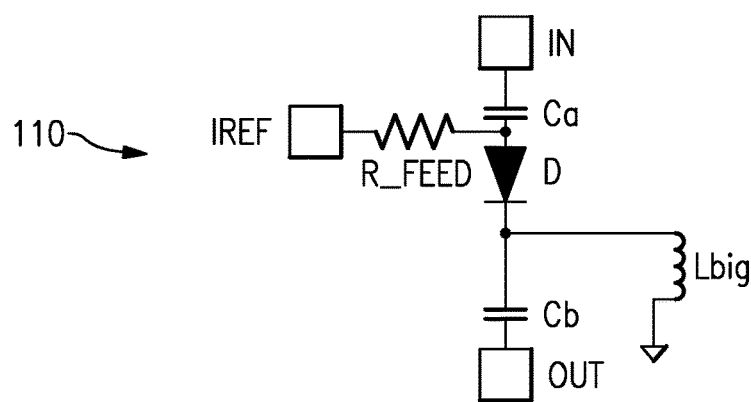
Figure 8C:
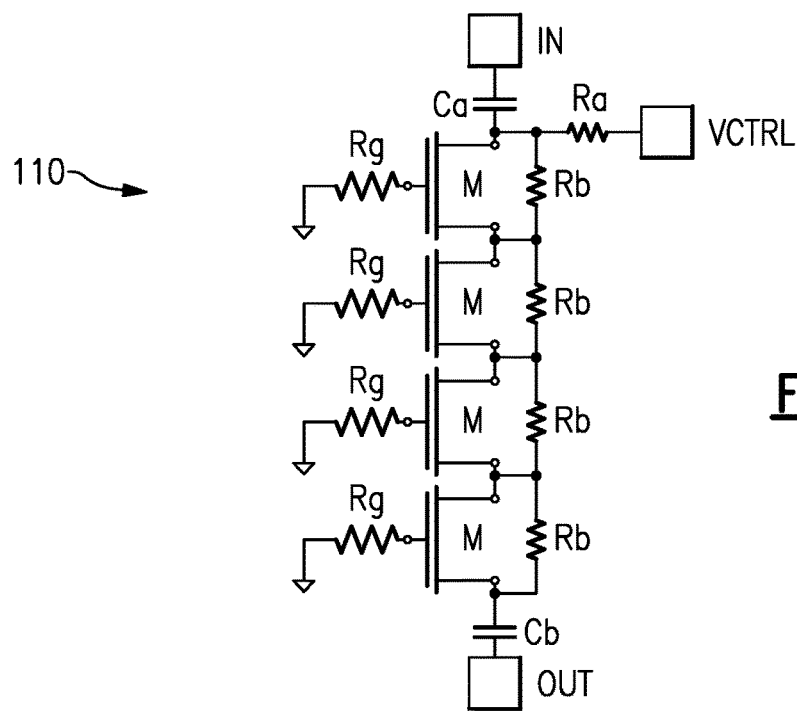

Examples of the variable resistance that can be implemented for the gain compensation circuit 110 are described herein in reference to FIGS. 8A to 8C.

It is noted that in the example of FIG. 5, the variable resistance circuit 110 can be implemented in situations where resistance dominates in the feedback of Q1, where a small impact on power added efficiency is desired or present, and where a high voltage swing at the variable resistance circuit 110 is acceptable or present.

Figure 6:
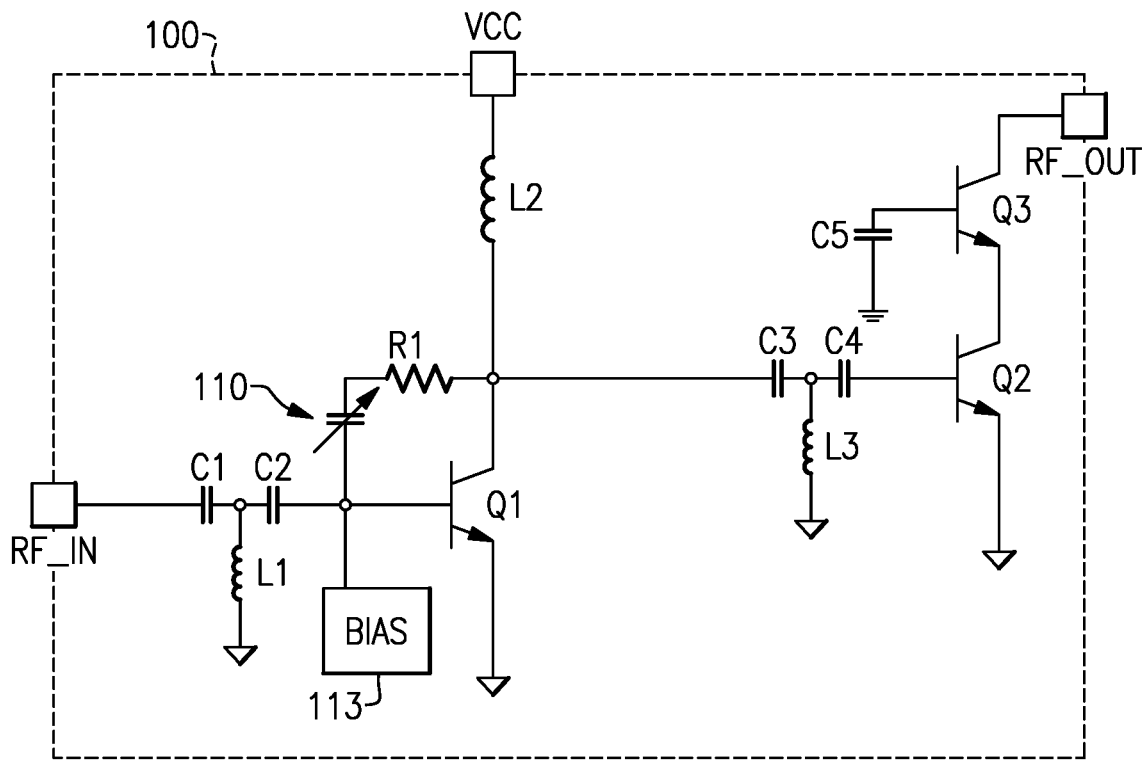
FIG. 6 another example where the power amplifier of FIG. 2 can include a gain compensation circuit implemented along a feedback circuit that couples an output of a transistor to an input of the transistor.

FIG. 6 shows that in some embodiments, the power amplifier 100 of FIG. 2 can include a gain compensation circuit 110 implemented along the feedback circuit that couples the output of Q1 to the input of Q1. In the example of FIG. 6, the gain compensation circuit 110 is shown to include a variable capacitance configured to provide variable capacitance in place of or in addition to the capacitance C6 described herein in reference to FIG. 2. Accordingly, in some embodiments, capacitance associated with the feedback circuit can be based on temperature of a module associate with the power amplifier 100.

Figure 9A:
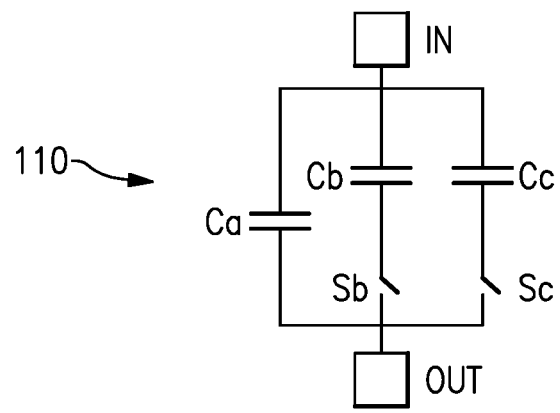
FIGS. 9A and 9B show examples of a variable capacitance circuit that can be utilized for the gain compensation circuit in the example power amplifier of FIG. 6.
Figure 9B:
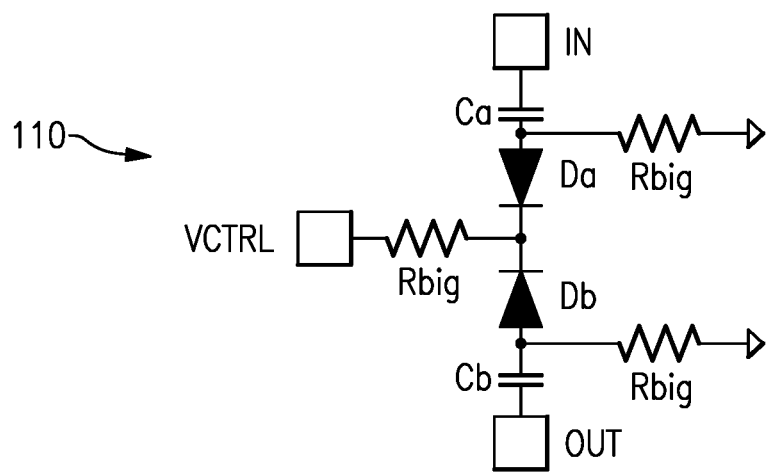

Examples of the variable capacitance that can be implemented for the gain compensation circuit 110 are described herein in reference to FIGS. 9A and 9B.

It is noted that in the example of FIG. 6, the variable resistance circuit 110 can be implemented in situations where capacitance dominates in the feedback of Q1, where a small impact on noise figure is desired or present, and where possible Hartley oscillation in the feedback is acceptable or present.

FIG. 7 shows an example of a variable attenuator 110 that can be utilized for the gain compensation circuit 110 in each of the example power amplifiers 100 of FIGS. 3 and 4. The example variable attenuator 110 of FIG. 7 is shown to have a pi configuration with a series resistance Ra between input and output nodes, and a shunt resistance Rb between each of the input and output nodes and ground.

In some embodiments, some or all of the resistances Ra, Rb, Rb can be configured to provide different resistance values based on control of, for example, switchable resistances, to provide different attenuation values between the input and output nodes. In some embodiments, one or more control signals associated with such operation of the variable attenuator 110 can be based on temperature of a module associated with the power amplifiers 100 of FIGS. 3 and 4, such that the different attenuation values between the input and output nodes are based on the temperature of the module.

FIGS. 8A to 8C show examples of a variable resistance circuit 110 that can be utilized for the gain compensation circuit 110 in the example power amplifier 100 of FIG. 5. In each of the examples of FIGS. 8A to 8C, the respective variable resistance circuit 110 is shown to be implemented between input and output nodes. Referring to FIG. 5, the input node can be coupled to the output of Q1, and the output node can be coupled to the capacitance C6.

FIG. 8A shows that in some embodiments, the variable resistance circuit 110 can include a plurality of resistances arranged to be electrically parallel between the input and output nodes, with at least one of such resistances being switchable to provide a plurality of overall resistance values between the input and output nodes. For example, in FIG. 8A, three resistances Ra, Rb, Rc are shown to be arranged to be electrically parallel between the input and output nodes. A switch Sb is shown to be in series with the resistance Rb, and a switch Sc is shown to be in series with the resistance Rc. Thus, the overall resistance values between the input and output nodes can include those associated with Ra alone (each of Sb and Sc open), Ra and Rb in parallel (Sb closed, Sc open), Ra and Rc parallel (Sb open, Sc closed), and all of Ra, Rb and Rc in parallel (each of Sb and Sc closed).

In the example of FIG. 8A, a control signal can be provided to control the two example switches Sb, Sc, to thereby control the overall resistance between the input and output nodes. More particularly, in the example configuration of FIG. 8A, value of the overall resistance decreases as the switches close by providing respective parallel path(s). Thus, the control signal can be configured to increase or decrease the overall resistance based on temperature (e.g., of the module associated with the respective power amplifier).

It is noted that the variable resistance circuit 110 of FIG. 8A is an example where a number of resistance values can be provided in discrete steps. The number of such resistance values and the discrete step sizes can be provided by an appropriate choice of the number of switchable resistances and the values of the resistances. For example, in the example of FIG. 8A, the two switches (Sb, Sc) are shown to provide four resistance states. In another example, suppose that a compensation range of 4 dB is desired for a power amplifier. In such a situation, four switches in the variable resistance circuit 110 of FIG. 8A can provide 16 different resistance values, and such resistance values can allow the 4 dB gain range to be achieved in approximately 0.25 dB gain steps.

In some embodiments, the resistances in the example of FIG. 8A can be implemented utilizing processes such as BiHEMT, CMOS or SOI process. In some embodiments, such resistance devices can be implemented on the same die as the corresponding switches or on a separate die from the switches. In some embodiments, the variable resistance circuit 110 of FIG. 8A can be implemented on the same die as the corresponding power amplifier. In some embodiments, the variable resistance circuit 110 of FIG. 8A can be implemented on a die separate from a die with the corresponding power amplifier.

FIG. 8B shows an example of a variable resistance circuit 110 that can be utilized for the gain compensation circuit 110 in the example power amplifier 100 of FIG. 5. In some embodiments, the variable resistance circuit 110 can be configured to provide a diode based resistance to provide an analog control of an overall resistance between input and output nodes, thereby allowing analog control of gain compensation for the corresponding power amplifier 100.

For example, and referring to FIG. 8B, a diode D can be provided between the input and output nodes, with the anode being on the input side and the cathode being on the output side. A capacitance Ca is shown to be between the anode of the diode D and the input node, and a capacitance Cb is shown to be between the cathode of the diode D and the output node. An inductance Lbig is shown to couple a node between the diode D and the capacitance Cb to ground.

In the example of FIG. 8B, a reference current (IREF) is shown to be provided to the anode of the diode D through a resistance R_Feed to control the resistance being provided by the diode D. More particularly, in the example configuration of FIG. 8B, value of the resistance provided by the diode D decreases as the reference current IREF increases. Thus, a control signal in the form of IREF can be configured to increase or decrease the resistance based on temperature (e.g., of the module associated with the respective power amplifier).

In some embodiments, the diode based resistance in the example of FIG. 8B can be implemented utilizing, for example, an HBT process. In some embodiments, such a diode device can be implemented as a transistor device with capacitance(s) (e.g., Ca and/or Cb) being inherent with the transistor device. In some embodiments, the variable resistance circuit 110 of FIG. 8B can be implemented on the same die as the corresponding power amplifier (e.g., HBT power amplifier). In some embodiments, the variable resistance circuit 110 of FIG. 8B can be implemented on a die separate from a die with the corresponding power amplifier.

FIG. 8C shows another example of a variable resistance circuit 110 that can be utilized for the gain compensation circuit 110 in the example power amplifier 100 of FIG. 5. In some embodiments, the variable resistance circuit 110 can be configured to include a variable BiHEMT resistor to provide an analog control of an overall resistance between input and output nodes, thereby allowing analog control of gain compensation for the corresponding power amplifier 100.

For example, and referring to FIG. 8C, a plurality of BiHEMT transistors can be arranged in series, and a resistance Rb can be provided between source and drain of each transistor. Such an assembly is shown to be implemented between input and output nodes. A capacitance Ca is shown to be provided between the input node and the first transistor, and a capacitance Cb is shown to be provided between the last transistor and the output node.

In the example of FIG. 8C, the overall resistance between the input and output nodes can be controlled by a control voltage VCTRL provided to a node between the capacitance Ca and the first transistor. More particularly, in the example configuration of FIG. 8C, value of the overall resistance provided by the BiHEMT transistor circuit increases as the control voltage VCTRL increases. Thus, a control signal in the form of VCTRL can be configured to increase or decrease the resistance based on temperature (e.g., of the module associated with the respective power amplifier).

In some embodiments, the BiHEMT transistor based resistance circuit 110 in the example of FIG. 8C can be implemented on the same die as the corresponding power amplifier. In some embodiments, the variable resistance circuit 110 of FIG. 8C can be implemented on a die separate from a die with the corresponding power amplifier.

FIGS. 9A and 9B show examples of a variable capacitance circuit 110 that can be utilized for the gain compensation circuit 110 in the example power amplifier 100 of FIG. 6. In each of the examples of FIGS. 9A and 9B, the respective variable capacitance circuit 110 is shown to be implemented between input and output nodes. Referring to FIG. 6, the input node can be coupled to the resistance R1, and the output node can be coupled to the input of Q1.

FIG. 9A shows that in some embodiments, the variable capacitance circuit 110 can include a plurality of capacitances arranged to be electrically parallel between the input and output nodes, with at least one of such capacitances being switchable to provide a plurality of overall capacitance values between the input and output nodes. For example, in FIG. 9A, three capacitances Ca, Cb, Cc are shown to be arranged to be electrically parallel between the input and output nodes. A switch Sb is shown to be in series with the capacitance Cb, and a switch Sc is shown to be in series with the capacitance Cc. Thus, the overall capacitance values between the input and output nodes can include those associated with Ca alone (each of Sb and Sc open), Ca and Cb in parallel (Sb closed, Sc open), Ca and Cc parallel (Sb open, Sc closed), and all of Ca, Cb and Cc in parallel (each of Sb and Sc closed).

In the example of FIG. 9A, a control signal can be provided to control the two example switches Sb, Sc, to thereby control the overall capacitance between the input and output nodes. More particularly, in the example configuration of FIG. 9A, value of the overall capacitance increases as the switches close by providing respective parallel path(s). Thus, the control signal can be configured to increase or decrease the overall capacitance based on temperature (e.g., of the module associated with the respective power amplifier).

It is noted that the variable capacitance circuit 110 of FIG. 9A is an example where a number of capacitance values can be provided in discrete steps. The number of such capacitance values and the discrete step sizes can be provided by an appropriate choice of the number of switchable capacitances and the values of the capacitances. For example, in the example of FIG. 9A, the two switches (Sb, Sc) are shown to provide four capacitance states.

In some embodiments, the variable capacitance circuit 110 of FIG. 9A can be implemented on the same die as the corresponding switches or on a separate die from the switches. In some embodiments, the variable capacitance circuit 110 of FIG. 9A can be implemented on the same die as the corresponding power amplifier. In some embodiments, the variable capacitance circuit 110 of FIG. 9A can be implemented on a die separate from a die with the corresponding power amplifier.

FIG. 9B shows an example of a variable capacitance circuit 110 that can be utilized for the gain compensation circuit 110 in the example power amplifier 100 of FIG. 6. In some embodiments, the variable capacitance circuit 110 can be configured to provide a diode based capacitance to provide an analog control of an overall capacitance between input and output nodes, thereby allowing analog control of gain compensation for the corresponding power amplifier 100.

For example, and referring to FIG. 9B, diodes Da and Db can be provided between the input and output nodes, with the anode of the diode Da being on the input side, the anode of the diode Db being on the output side, and the cathodes of the diodes Da, Db being coupled to each other. A capacitance Ca is shown to be between the anode of the diode Da and the input node, and a capacitance Cb is shown to be between the anode of the diode Db and the output node. A resistance Rbig is shown to couple a node between the diode Da and the capacitance Ca to ground, and a resistance Rbig is shown to couple a node between the diode Db and the capacitance Cb to ground.

In the example of FIG. 9B, a control voltage (VCTRL) is shown to be provided to a node between the cathodes of the diodes Da, Db through a resistance Rbig to control the capacitance being provided by the diodes Da, Db. More particularly, in the example configuration of FIG. 9B, value of the capacitance provided by the diodes Da, Db decreases as the control voltage VCTRL increases. Thus, a control signal in the form of VCTRL can be configured to increase or decrease the capacitance based on temperature (e.g., of the module associated with the respective power amplifier).

In some embodiments, the diode based capacitance in the example of FIG. 9B can be implemented utilizing, for example, an HBT process. In some embodiments, such diode devices can be implemented as transistor device with capacitance(s) (e.g., Ca and/or Cb) being inherent with the transistor devices. In some embodiments, the variable capacitance circuit 110 of FIG. 9B can be implemented on the same die as the corresponding power amplifier (e.g., HBT power amplifier). In some embodiments, the variable capacitance circuit 110 of FIG. 9B can be implemented on a die separate from a die with the corresponding power amplifier.

Figure 10:
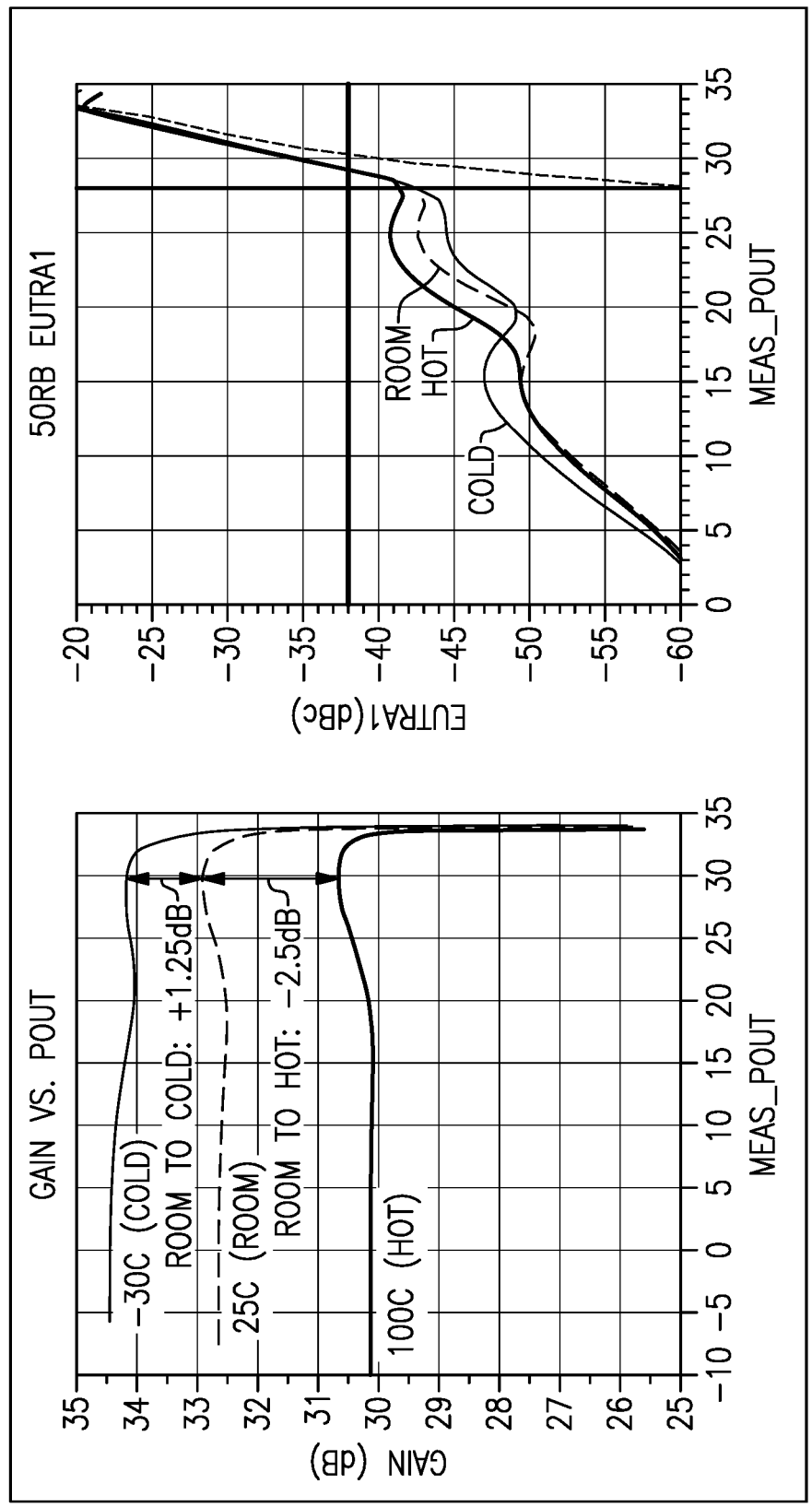
FIG. 10 shows examples of gain and linearity plots, and how such parameters can vary over a temperature range.

FIGS. 10 to 12 show various plots related to power amplifier operating conditions, performance, etc. that can be taken into account to design a desire configuration of a gain compensation circuit having one or more features as described herein.

FIG. 10 shows gain and linearity plots obtained by simulation, and how such parameters can vary over a temperature range. For example, the gain plots on the left panel show a significant decrease in gain as operating temperature goes from a cold value of −30° C. to a room temperature of 25° C. to a hot temperature of 100° C. More particularly, there is a gain decrease of about 1.25 dB when the temperature rises from −30° C. to 25° C., and a further gain decrease of about 2.5 dB when the temperature rises from 25° C. to 100° C. Assuming such a temperature range, one can configure a gain compensation circuit to provide gain compensation up to, for example, 4 dB.

FIGS. 11A to 11G show various plots related to power amplifier operating conditions, performance, etc. that can be taken into account to design a desired configuration of a gain compensation circuit implemented as the variable capacitance circuit 110 of FIG. 9B. Such a design configuration can include the example 4 dB gain compensation range described in reference to FIG. 10.

Figure 11A:
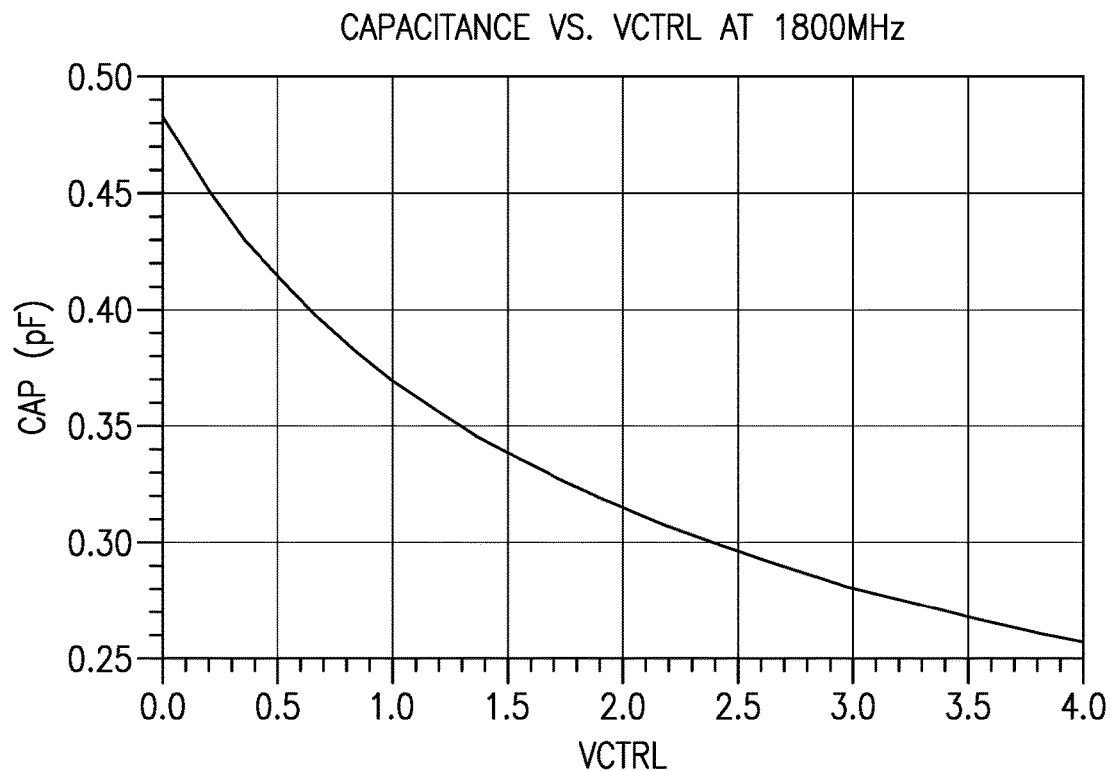
FIGS. 11A to 11G show various plots related to power amplifier operating conditions, performance, etc. that can be taken into account to design a desired configuration of a gain compensation circuit implemented with the variable capacitance circuit of FIG. 9B.

Referring to the variable capacitance circuit 110 of FIG. 9B, FIG. 11A shows a plot of capacitance that can be obtained by varying the control voltage VCTRL from 0V to 4.0V. One can see that if VCTRL is varied in a range of 0V to 3.0V, the resulting capacitance range of about 40% (from the capacitance of 0.48 pF at VCTRL=0) can be provided.

Figure 11B:
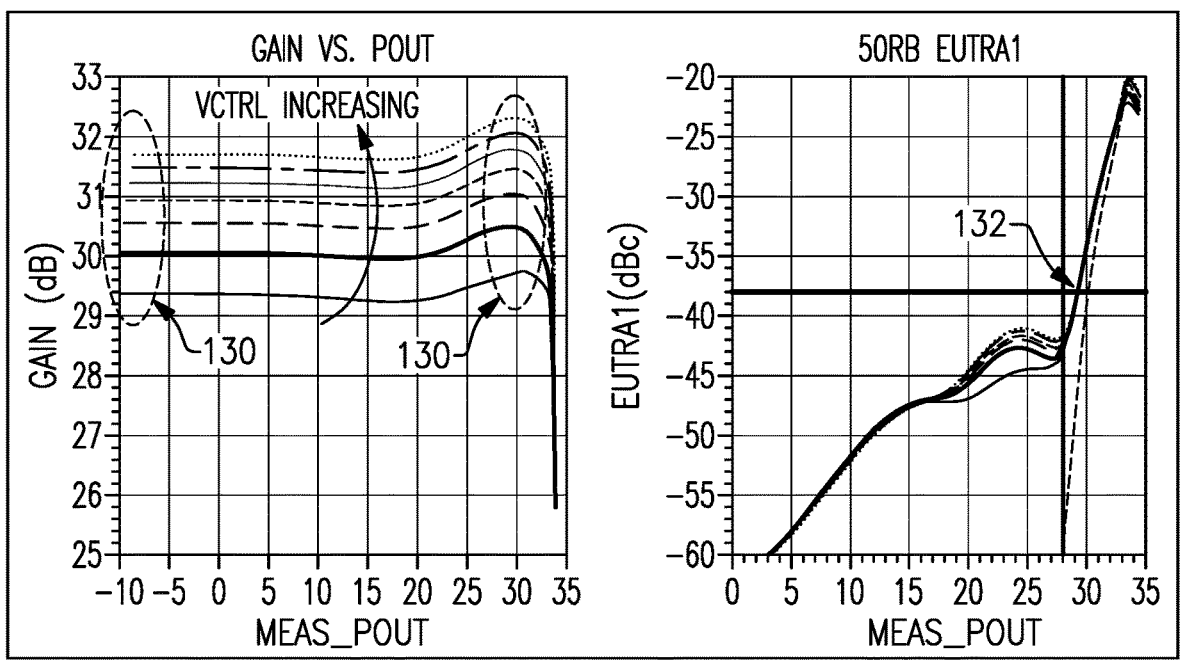

FIG. 11B shows gain and linearity plots for the power amplifier 100 of FIG. 6 when the variable capacitance circuit 110 of FIG. 9B is provided with a control voltage VCTRL without any temperature-dependent adjustment. Similar to the example of FIG. 11A, the control voltage VCTRL is adjusted in a range of 0V to 3.0V, in 0.5V steps, to yield a number of gain and linearity plots.

One can see from the gain plots on the left panel of FIG. 11B that as VCTRL increases (thereby decreasing the overall capacitance), the gain of the power amplifier increases. More particularly, a gain compensation of about 3 dB is shown to be available for the example control voltage range of 0V to 3.0V. Referring to the regions indicated as 130, it is also noted that the same gain control provided by the variable capacitance circuit 110 of FIG. 9B applies roughly the same for small signals having low output power and large signals having high output power.

One can also see from the linearity plot on the right panel of FIG. 11B, and more particularly at the region indicated as 132, that there is a relatively small shift in linear power relationship resulting from the variable capacitance circuit 110 of FIG. 9B operating in the example control voltage range of 0V to 3.0V.

Figure 11C:
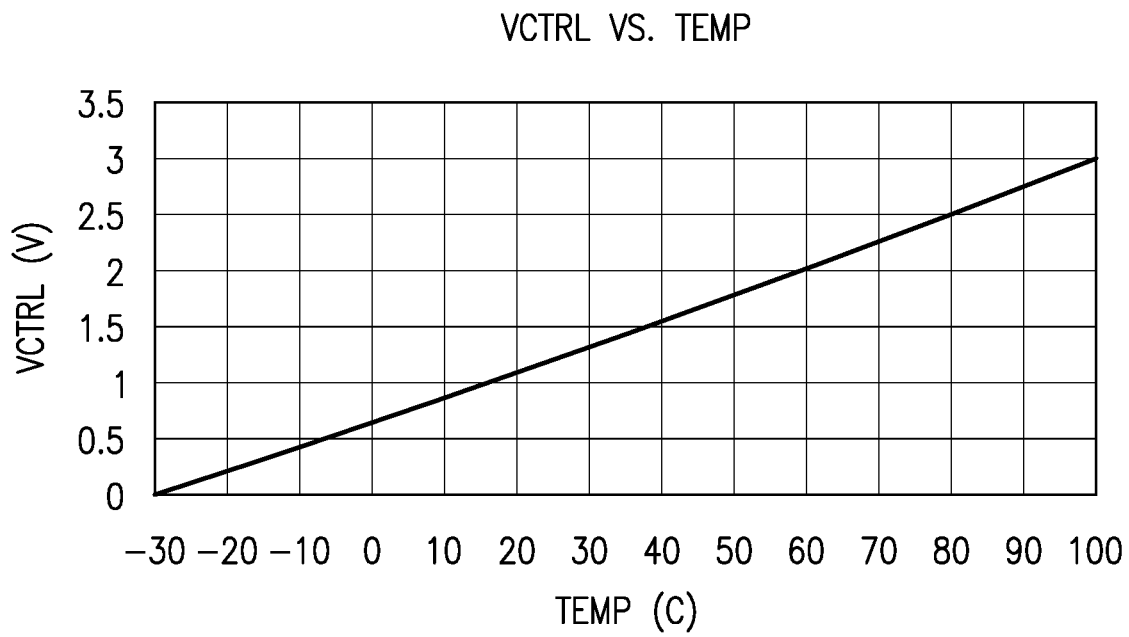

FIG. 11C shows an example of how the control voltage VCTRL being provided to the variable capacitance circuit 110 of FIG. 9B can be configured to depend on temperature (e.g., of the module associated with the respective power amplifier). For example, VCTRL can be estimated to depend on temperature in a linear manner and span the example control voltage range of 0V to 3.0V over an example temperature range of −35° C. to 100° C.

As described in reference to FIG. 2, a power amplifier having a gain compensation circuit such as the variable capacitance circuit 110 of FIG. 9B can include a biasing circuit 113. In some embodiments, such a biasing circuit can include a functionality of providing a temperature-compensated bias signal to the corresponding amplifying transistor (e.g., transistor Q1). In some embodiments, such a temperature-compensated bias signal can be based on a temperature-dependent reference current associated with the biasing circuit 113.

Figure 11D:
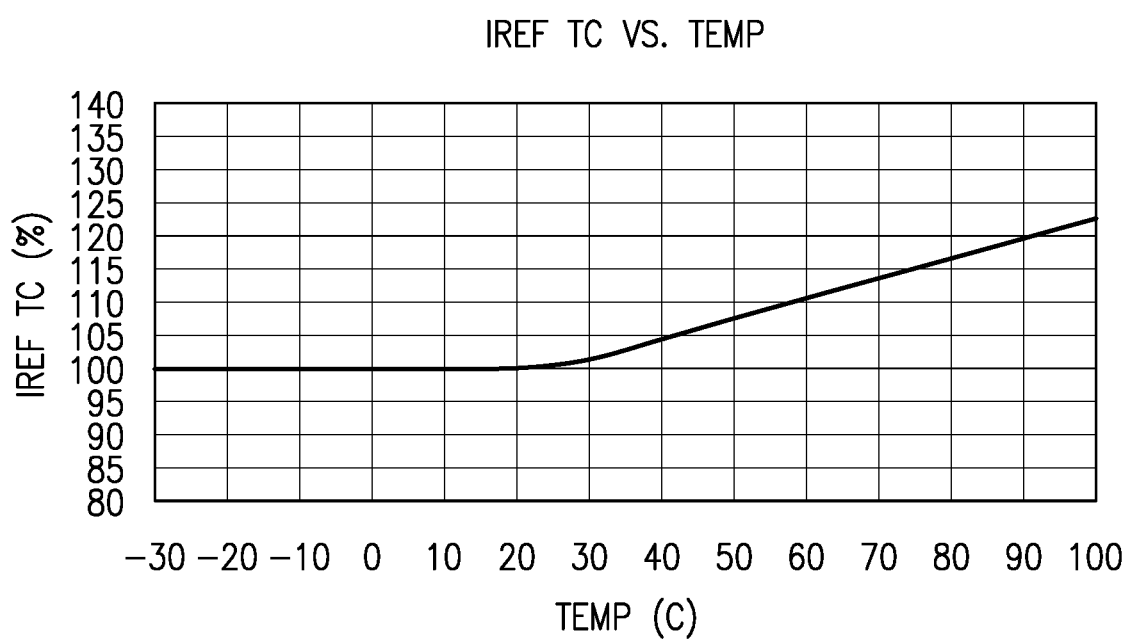

FIG. 11D shows an example of how a reference current for the biasing circuit 113 of the power amplifier 100 of FIG. 6 can be configured to depend on temperature (e.g., of the module associated with the respective power amplifier). For example, the reference current can be configured to have an approximately constant value when the temperature is less than or equal to 20° C., and to increase at a rate of approximately 0.3% per ° C. when the temperature is greater than 20° C.

Figure 11E:
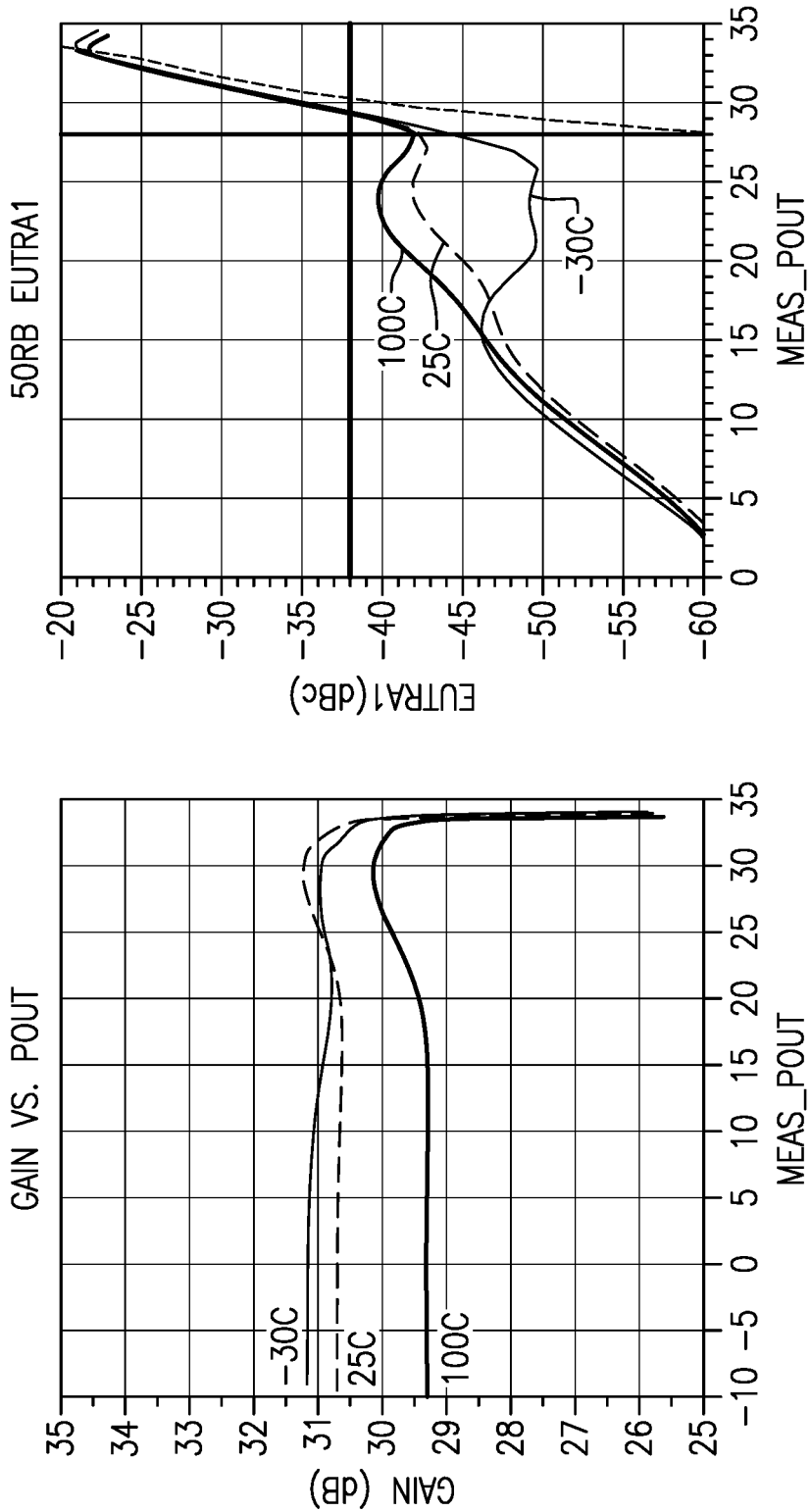

FIG. 11E shows gain and linearity plots for the power amplifier 100 of FIG. 6 when the variable capacitance circuit 110 of FIG. 9B is provided with the temperature-compensated control voltage VCTRL of FIG. 11C. In the example of FIG. 11E, bias signal provided from the biasing circuit 113 is not compensated for temperature (as in the example of FIG. 11D). Compared to the gain variation of FIG. 11B (where the control voltage VCTRL for the variable capacitance circuit 110 is not temperature-compensated), the gain variation at the output power (POUT) of 29 dBm is reduced from approximately 3.75 dB (for FIG. 11B) to approximately 1.25 dB (for FIG. 11E). One can also see from the linearity plot on the right panel of FIG. 11E that there is some degradation in linearity when compared to the example of FIG. 11B.

Figure 11F:
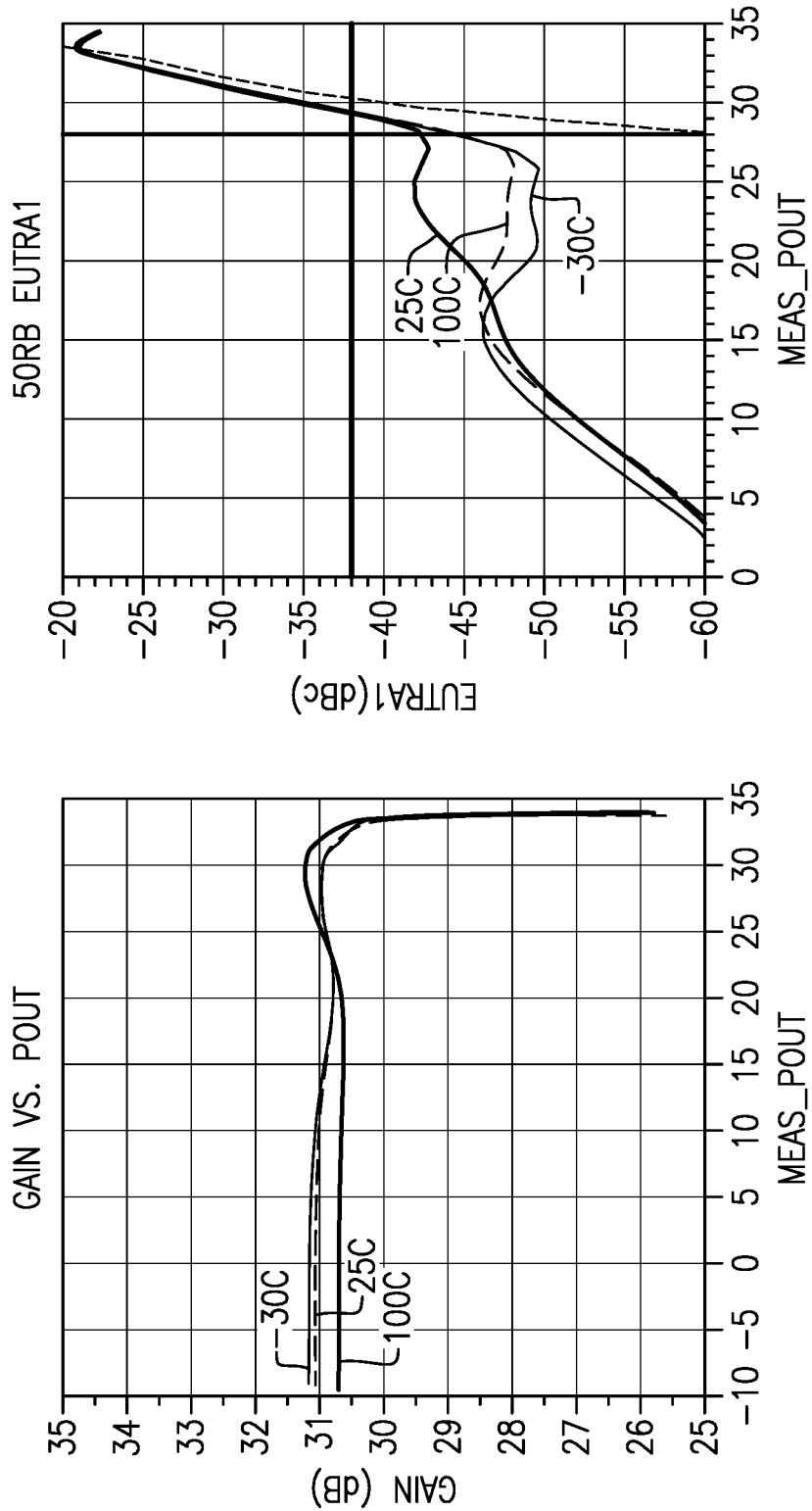

FIG. 11F shows gain and linearity plots for the power amplifier 100 of FIG. 6 when the variable capacitance circuit 110 of FIG. 9B is provided with the temperature-compensated control voltage VCTRL of FIG. 11C. In the example of FIG. 11E, bias signal provided from the biasing circuit 113 is compensated for temperature (i.e., with temperature-compensated reference current as in the example of FIG. 11D). Compared to the gain variation of FIG. 11E (where the control voltage VCTRL for the variable capacitance circuit 110 is temperature-compensated, but the reference current of the biasing circuit 113 is not temperature-compensated), the gain variation at the output power (POUT) of 29 dBm is further reduced from approximately 1.25 dB (for FIG. 11E) to approximately 0.25 dB (for FIG. 11F).

Figure 11G:
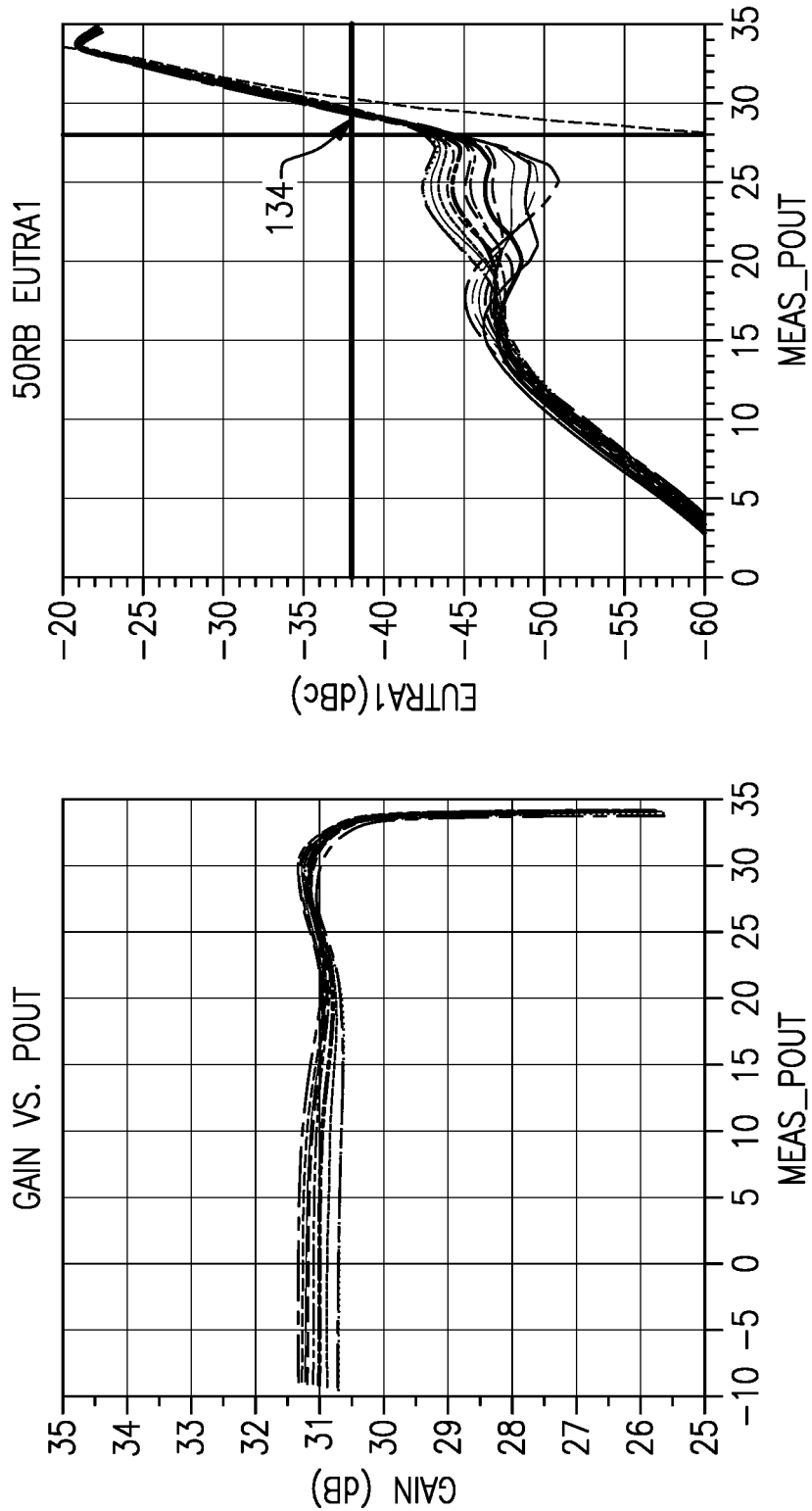

FIG. 11G shows gain and linearity plots for the power amplifier 100 of FIG. 6 configured and operated similarly as in the example of FIG. 11F, except the temperature is varied in 10° C. steps between the example range of −30° C. to 100° C. Similar to the example of FIG. 11F, the gain variation at the example output power of 29 dBm is quite low, at approximately 0.3 dB. Referring to the region indicated as 134, it is also noted that there is relatively small variation in linearity at the example output power of 29 dBm.

FIGS. 12A to 12G show various plots related to power amplifier operating conditions, performance, etc. that can be taken into account to design a desired configuration of a gain compensation circuit implemented for the variable resistance circuit 110 of FIG. 8C. Such a design configuration can include the example 4 dB gain compensation range described in reference to FIG. 10.

Figure 12A:
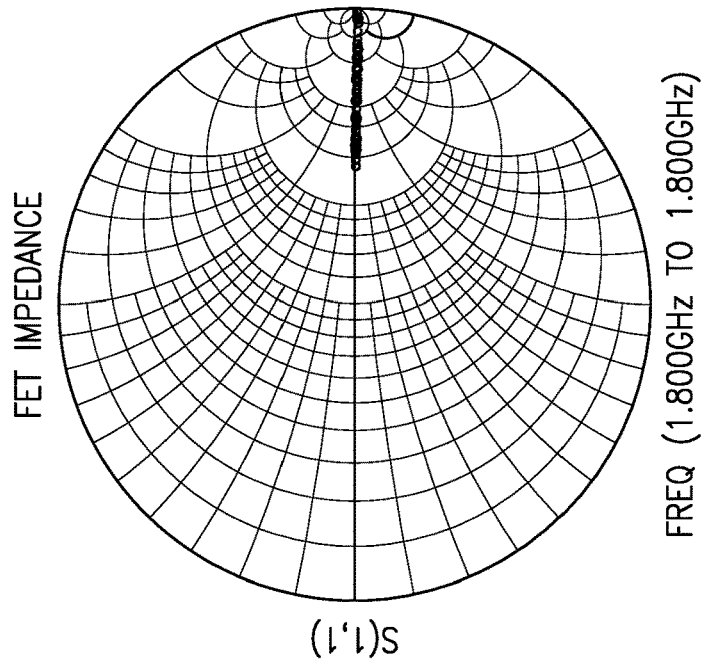
FIGS. 12A to 12G show various plots related to power amplifier operating conditions, performance, etc. that can be taken into account to design a desired configuration of a gain compensation circuit implemented with the variable resistance circuit of FIG. 8C.
Figure 12A:
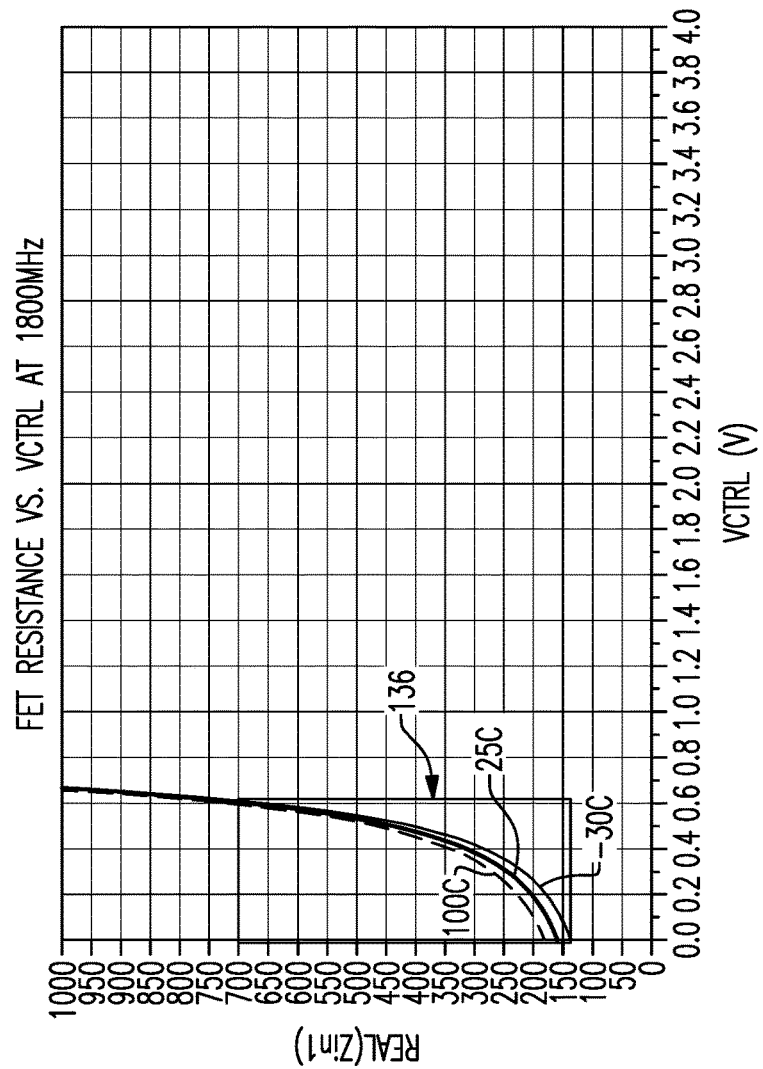

Referring to the variable resistance circuit 110 of FIG. 8C, FIG. 12A shows a plot of resistance that can be obtained by varying the control voltage VCTRL from 0V to 0.6V for the example temperatures of −30° C., 25° C. and 100° C. In the example of FIG. 12A, each resistance Rb in FIG. 8C has a value of 10 kOhm, and the transistors M have the same configuration (one finger with W=50 μm and L=0.8 μm). For such an example configuration of the variable resistance circuit, FIG. 12A shows an example of a useful tuning range 136 that can be utilized.

Figure 12B:
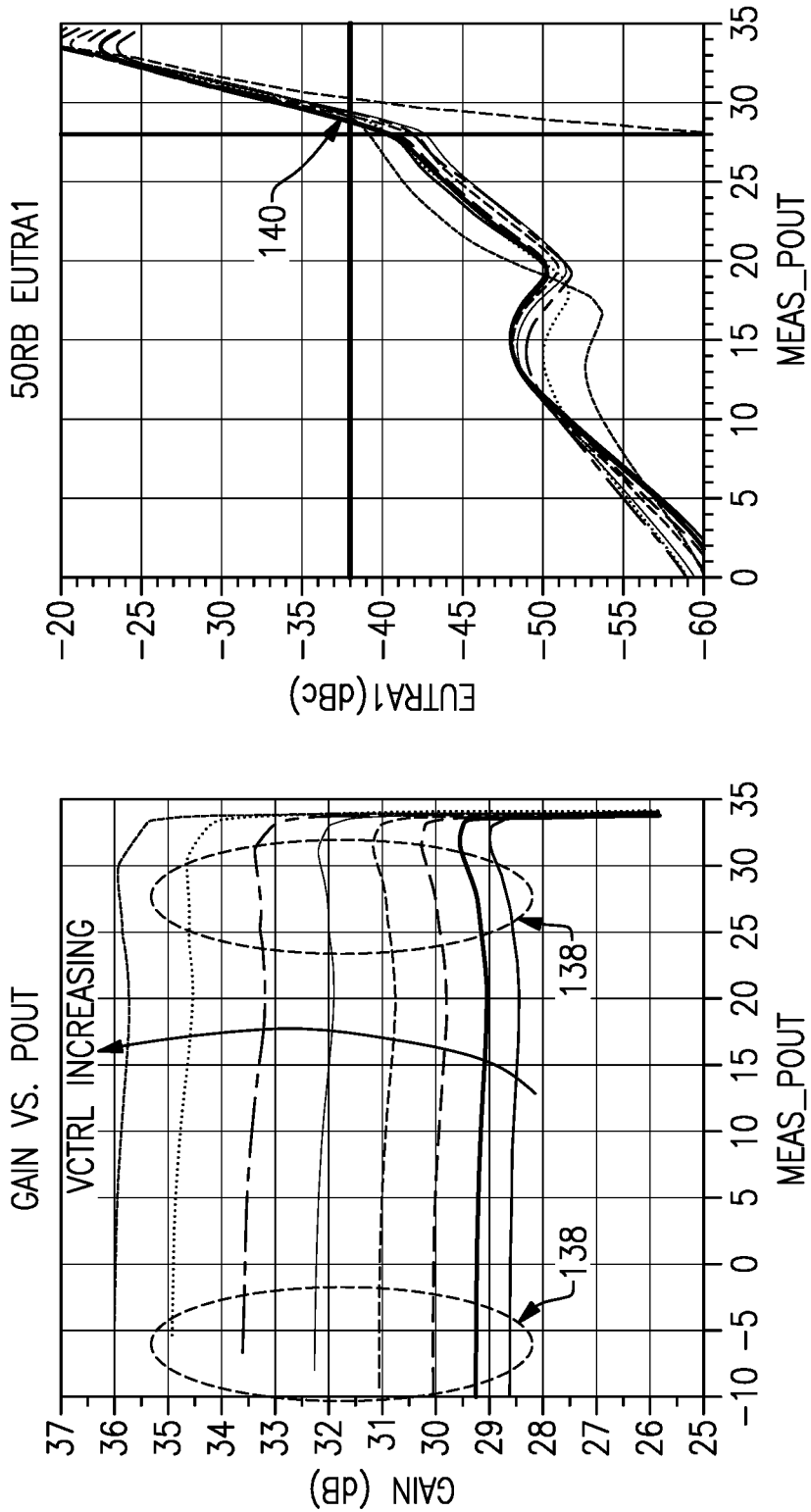

FIG. 12B shows gain and linearity plots for the power amplifier 100 of FIG. 5 when the variable resistance circuit 110 of FIG. 8C is provided with different values of control voltage VCTRL at room temperature (without any temperature-dependent adjustment). In the example of FIG. 12B, the control voltage VCTRL is adjusted in a range of 0V to 0.7V, in 0.1V steps, to yield a number of gain and linearity plots.

One can see from the gain plots on the left panel of FIG. 12B that as VCTRL increases (thereby increasing the overall resistance), the gain of the power amplifier increases. Referring to the regions indicated as 138, it is noted that the gain control provided by the variable resistance circuit 110 of FIG. 8C applies roughly the same for small signals having low output power and large signals having high output power.

One can also see from the linearity plot on the right panel of FIG. 12B (e.g., region indicated as 140) that there is some shift in linear power relationship resulting from the variable resistance circuit 110 of FIG. 8C operating in the example control voltage range of 0V to 0.7V.

Figure 12C:
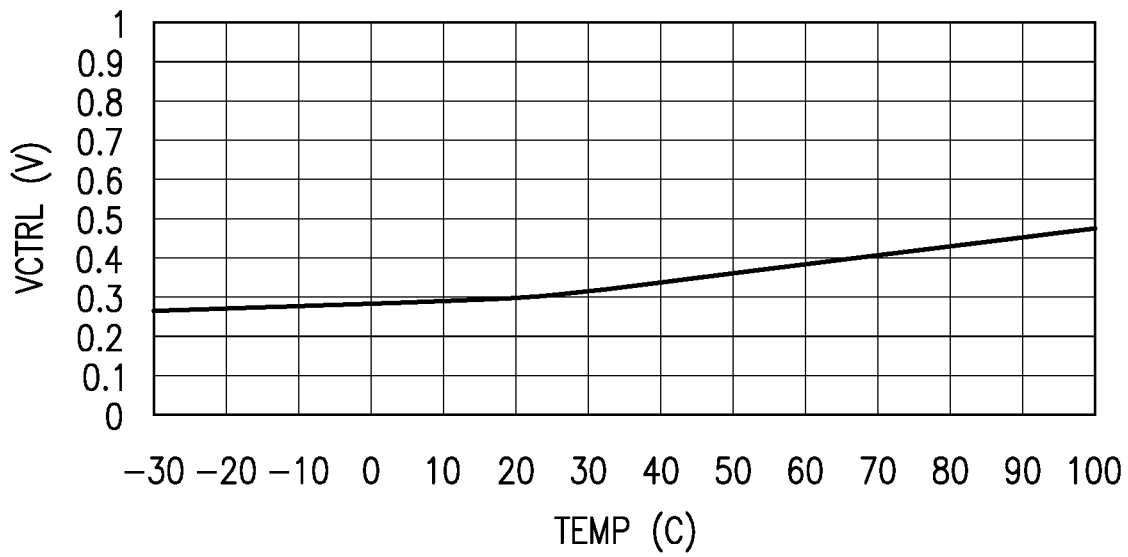

FIG. 12C shows an example of how the control voltage VCTRL being provided to the variable resistance circuit 110 of FIG. 8C can be configured to depend on temperature (e.g., of the module associated with the respective power amplifier). For example, VCTRL can be configured to depend on temperature in a first linear manner for temperature less than or equal to 25° C., and a second linear manner for temperature greater than 25° C. Such linear relationships can be based on, for example, VCTRL=0.265V at −30° C., VCTRL=0.30V at 25° C., and VCTRL=0.475V at 100° C.

As described in reference to FIG. 2, a power amplifier having a gain compensation circuit such as the variable resistance circuit 110 of FIG. 8C can include a biasing circuit 113. In some embodiments, such a biasing circuit can include a functionality of providing a temperature-compensated bias signal to the corresponding amplifying transistor (e.g., transistor Q1). In some embodiments, such a temperature-compensated bias signal can be based on a temperature-dependent reference current associated with the biasing circuit 113.

Figure 12D:
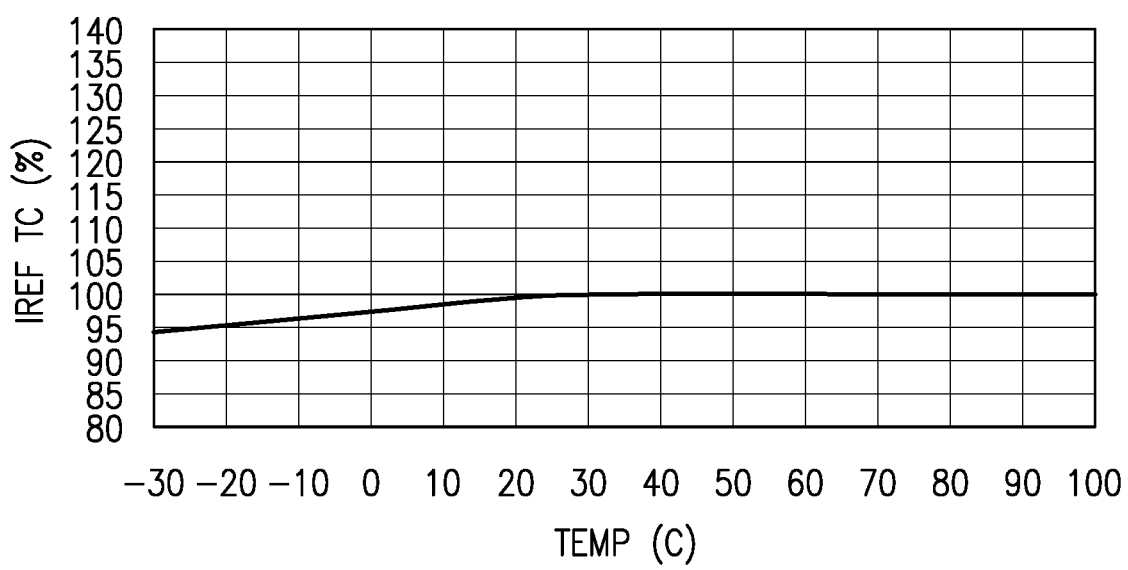

FIG. 12D shows an example of how a reference current for the biasing circuit 113 of the power amplifier 100 of FIG. 5 can be configured to depend on temperature (e.g., of the module associated with the respective power amplifier). For example, the reference current can be configured to have an approximately constant value when the temperature is greater than or equal to 20° C., and to change at a rate of approximately −0.1% per ° C. when the temperature is less than 20° C.

Figure 12E:
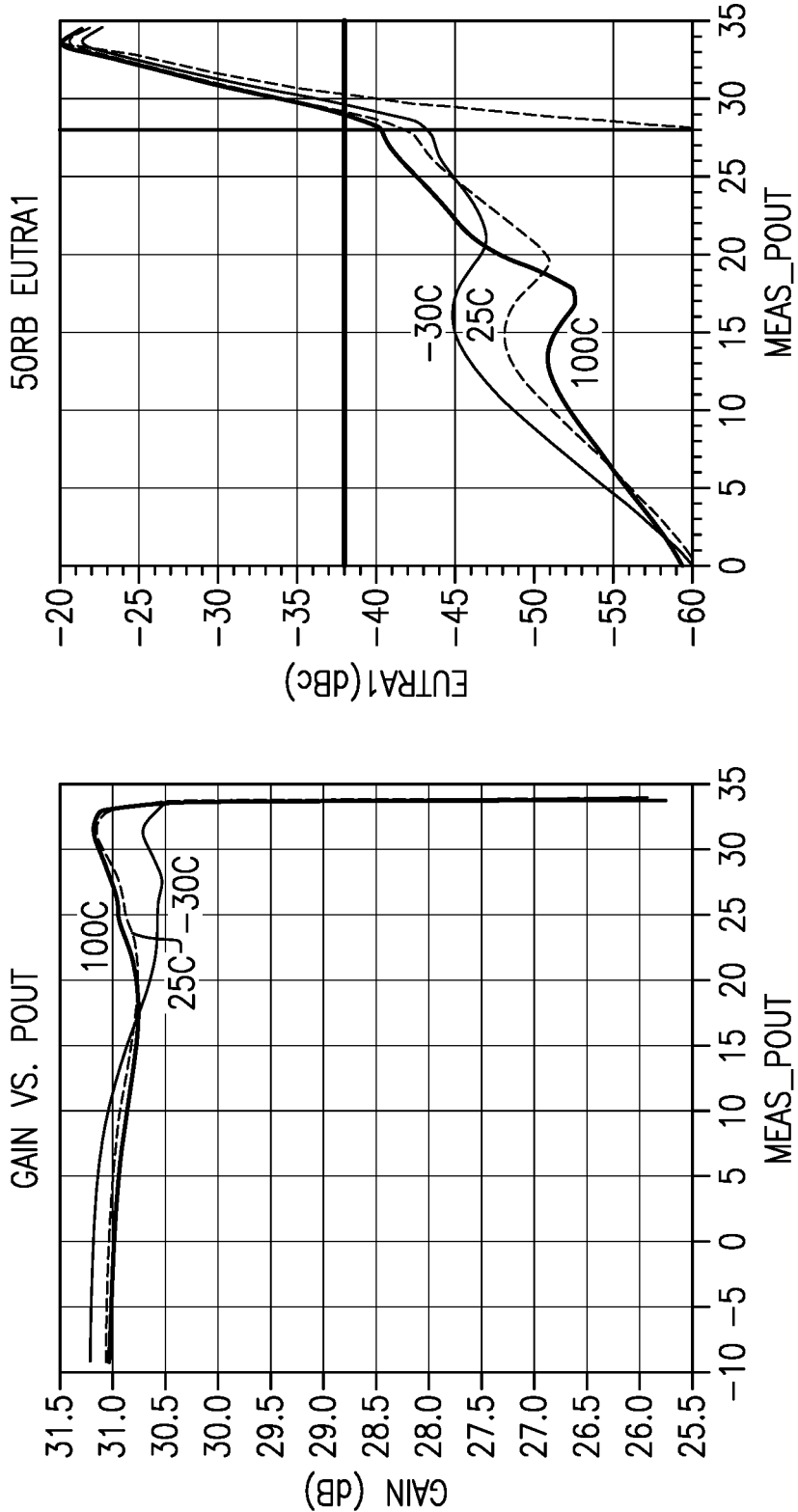

FIG. 12E shows gain and linearity plots for the power amplifier 100 of FIG. 5 when the variable capacitance circuit 110 of FIG. 8C is provided with the temperature-compensated control voltage VCTRL of FIG. 12C. In the example of FIG. 12E, bias signal provided from the biasing circuit 113 is not compensated for temperature (as in the example of FIG. 12D). Compared to the gain variation of FIG. 12B (where the control voltage VCTRL for the variable resistance circuit 110 is not temperature-compensated), the gain variation at the output power (POUT) of 29 dBm is reduced from approximately 3.75 dB (for FIG. 12B) to approximately 0.5 dB (for FIG. 12E). One can also see AMAM deviation at the example temperature of −30° C.

Figure 12F:
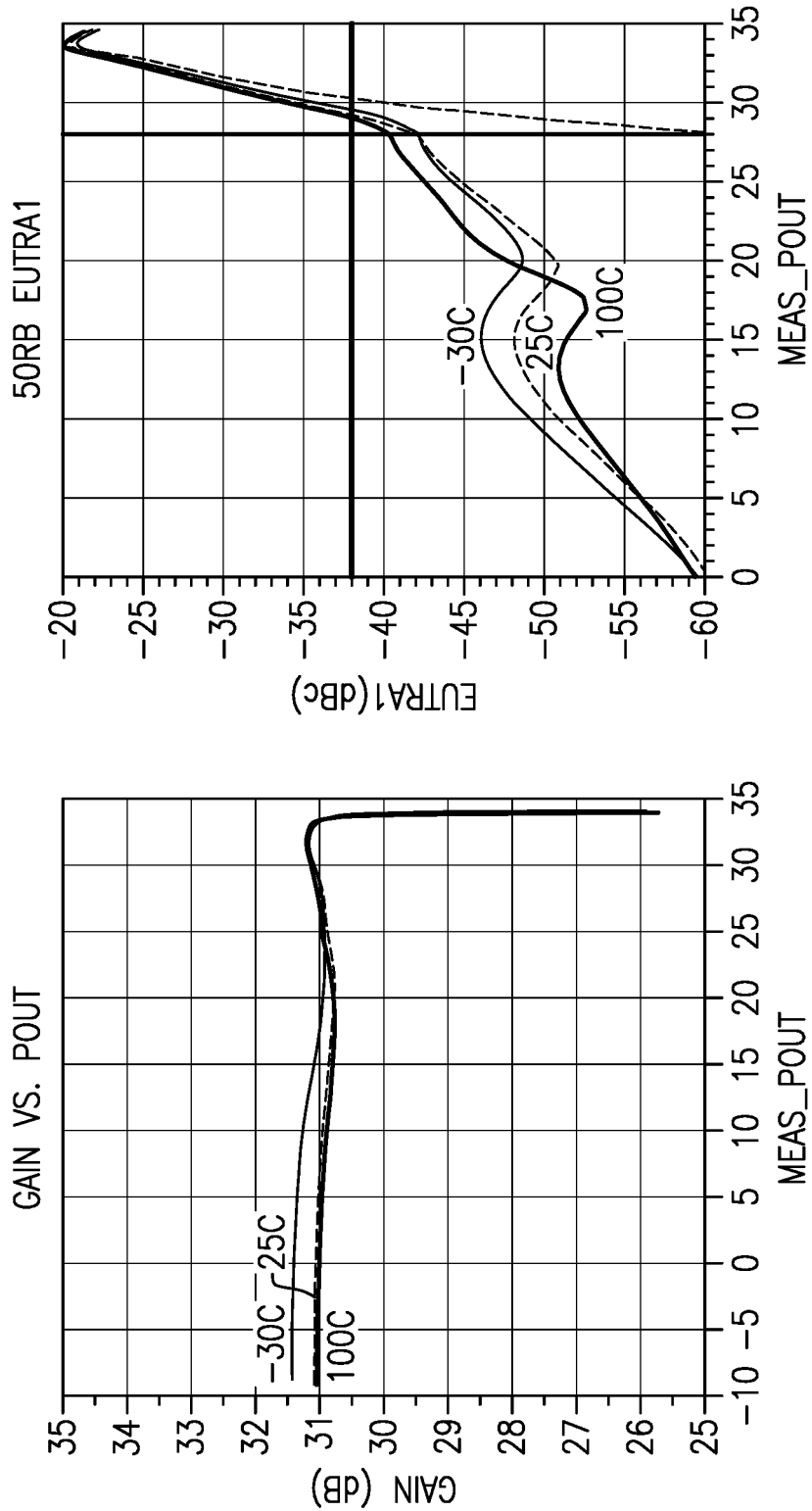

FIG. 12F shows gain and linearity plots for the power amplifier 100 of FIG. 5 when the variable resistance circuit 110 of FIG. 8C is provided with the temperature-compensated control voltage VCTRL of FIG. 12C. In the example of FIG. 12E, bias signal provided from the biasing circuit 113 is compensated for temperature (i.e., with temperature-compensated reference current as in the example of FIG. 12D). Compared to the gain variation of FIG. 12E (where the control voltage VCTRL for the variable resistance circuit 110 is temperature-compensated, but the reference current of the biasing circuit 113 is not temperature-compensated), the gain variation at the output power (POUT) of 29 dBm is further reduced from approximately 0.5 dB (for FIG. 12E) to approximately 0.07 dB (for FIG. 12F).

Figure 12G:
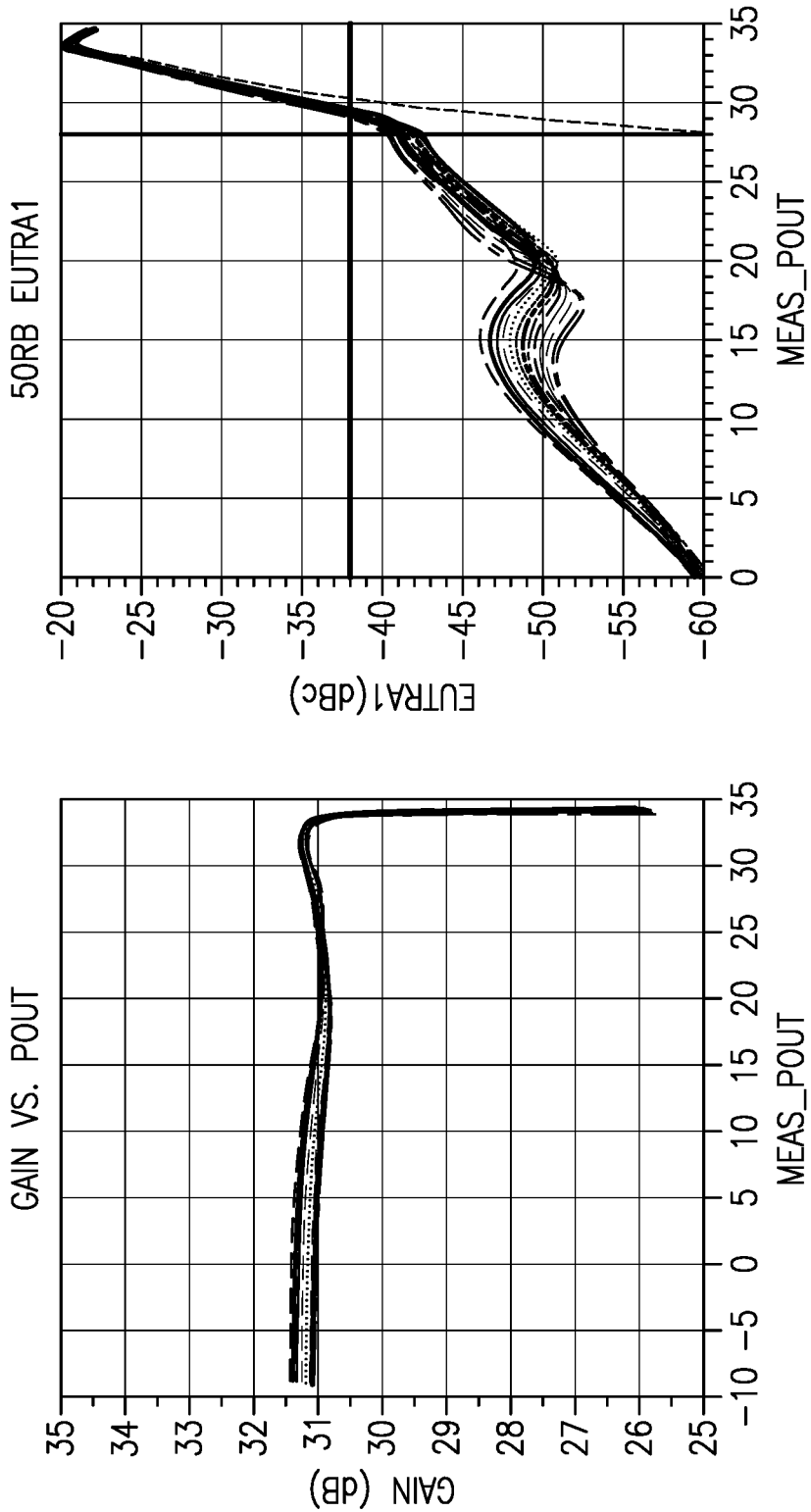

FIG. 12G shows gain and linearity plots for the power amplifier 100 of FIG. 5 configured and operated similarly as in the example of FIG. 12F, except the temperature is varied in 10° C. steps between the example range of −30° C. to 100° C. Similar to the example of FIG. 12F, the gain variation at the example output power of 29 dBm is quite low, at approximately 0.15 dB.

One can see that a power amplifier having one or more features as described herein can have very little or virtually zero gain variation over a wide range of temperature, thereby reducing calibration time and/or demand for power from a transceiver to obtain a desired output power.

It will be understood that in some embodiments, one or more features of the present disclosure can also be implemented in other types of amplifiers (e.g., other than power amplifiers).

It will also be understood that while various examples are described in the context of amplifying transistors being implemented as bipolar-junction transistors, one or more features of the present disclosure can also be implemented in amplifiers utilizing other types of amplifying transistors.

It will also be understood that while the second stage of the amplifier is described as having a cascode configuration, one or more features of the present disclosure can also be implemented in amplifiers utilizing a non-cascode configuration for a second stage.

Figure 13:
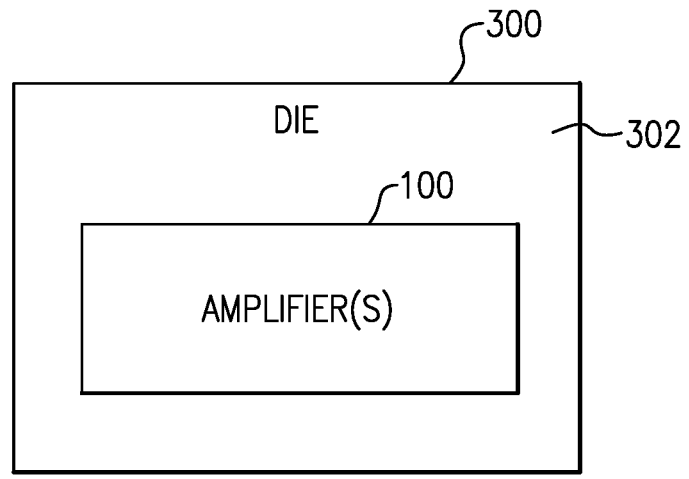
FIG. 13 shows that in some embodiments, a semiconductor die can include one or more amplifiers as described herein.

FIG. 13 shows that in some embodiments, a semiconductor die 300 can include one or more amplifiers 100 as described herein. Such amplifier(s) can be implemented on a semiconductor substrate 302.

Figure 14:
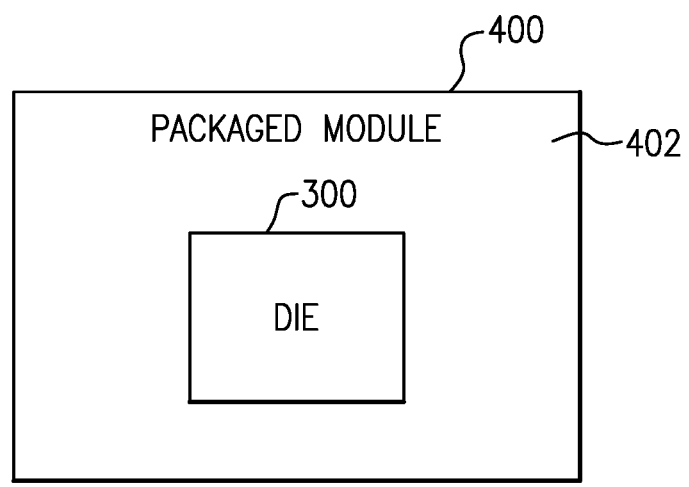
FIG. 14 shows that in some embodiments, one or more features as described herein can be implemented in a packaged module.

FIG. 14 shows that in some embodiments, one or more features as described herein can be implemented in a packaged module 400. Such a packaged module can include a packaging substrate 402 configured to receive a plurality of components. At least some of the components mounted on the packaging substrate 402 can include a die 300 such as one or more of the example die 300 of FIG. 13.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 15:
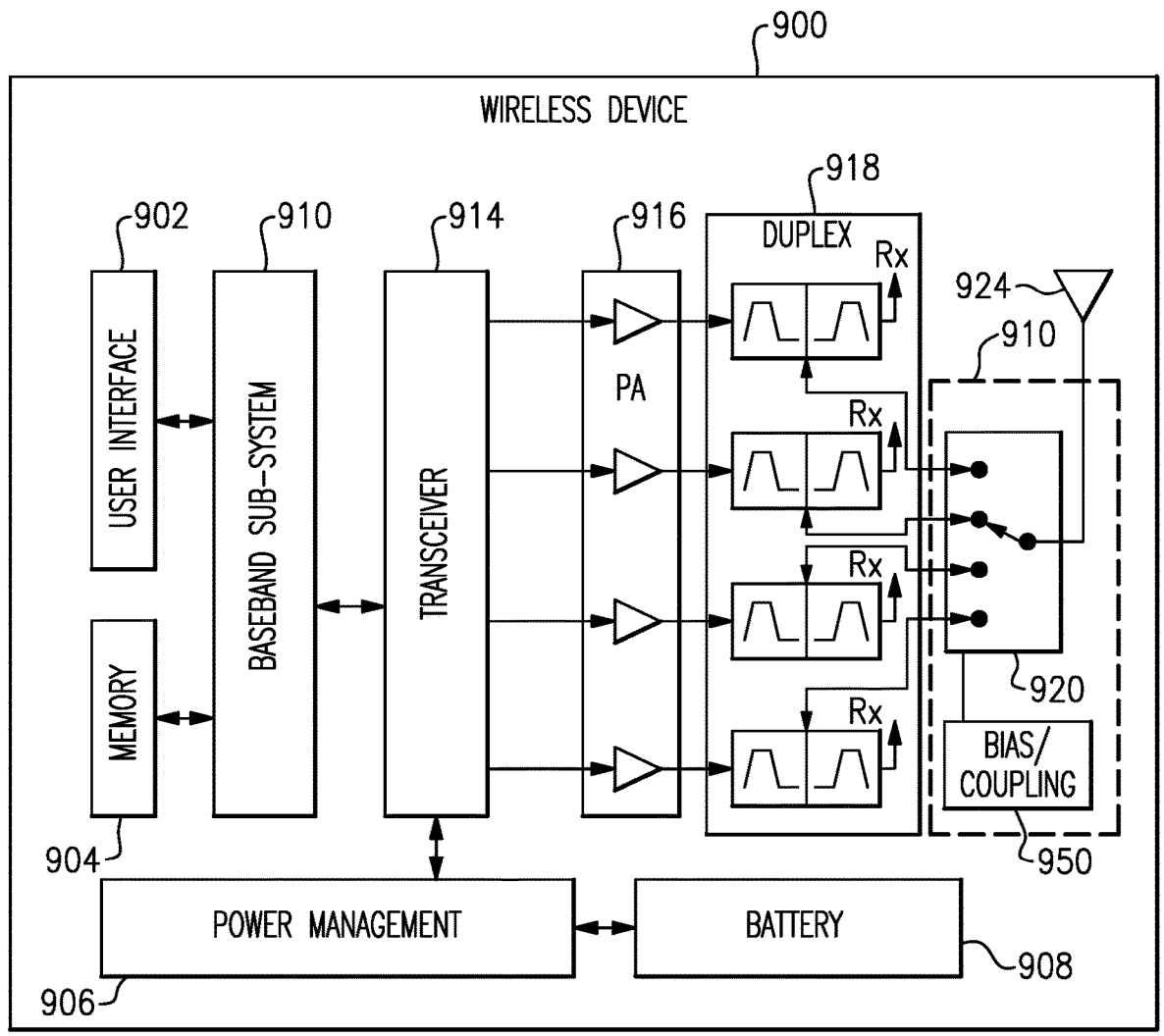
FIG. 15 depicts an example wireless device having one or more advantageous features described herein.

FIG. 15 depicts an example wireless device 900 having one or more advantageous features described herein. In some embodiments, one or more power amplifiers 916 can include a gain compensation feature as described herein.

In the example wireless device 900, a power amplifier (PA) assembly 916 having a plurality of PAs can provide one or more amplified RF signals to the switch 920 (via an assembly of one or more duplexers 918), and the switch 920 can route the amplified RF signal(s) to one or more antennas. The PAs 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 910.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 15, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
an input stage that includes an amplifying transistor having an input node and an output node, such that a signal at the input node has a first power level and an amplified signal at the output node has a second power level;
a bias circuit configured to provide a bias signal to the amplifying transistor;
a feedback circuit that couples the output node of the amplifying transistor to the input node of the amplifying transistor, the feedback circuit including a resistance and a capacitance arranged in series; and
a gain compensation circuit implemented along an output path from the output node of the amplifying transistor, such that the gain compensation circuit adjusts the second power level based on a variation in temperature associated with the power amplifier.

2. The power amplifier of claim 1 wherein the gain compensation circuit includes a variable attenuator configured to provide different attenuation values based on a control signal that depends on the variation in temperature.

3. The power amplifier of claim 1 further comprising a second stage configured to further amplify the amplified signal from the input stage.

4. The power amplifier of claim 1 wherein the bias circuit is configured such that the bias signal provided to the amplifying transistor depends on the variation in temperature.

5. A power amplifier comprising:
an input stage that includes an amplifying transistor having an input node and an output node, such that a signal at the input node has a first power level and an amplified signal at the output node has a second power level;
a bias circuit configured to provide a bias signal to the amplifying transistor;
a feedback circuit that couples the output node of the amplifying transistor to the input node of the amplifying transistor, the feedback circuit including a resistance and a capacitance arranged in series; and
a gain compensation circuit implemented along the feedback circuit to adjust a gain of the input stage based on the variation in temperature, the gain compensation circuit including the resistance of the feedback circuit implemented as a variable resistance circuit configured to provide a variable resistance value based on the variation in temperature, the variable resistance circuit including a diode resistance circuit controlled by a control signal that depends on the variation in temperature.

6. A power amplifier comprising:
an input stage that includes an amplifying transistor having an input node and an output node, such that a signal at the input node has a first power level and an amplified signal at the output node has a second power level;
a bias circuit configured to provide a bias signal to the amplifying transistor;
a feedback circuit that couples the output node of the amplifying transistor to the input node of the amplifying transistor, the feedback circuit including a resistance and a capacitance arranged in series; and
a gain compensation circuit implemented along the feedback circuit to adjust a gain of the input stage based on the variation in temperature, the gain compensation circuit including the resistance of the feedback circuit implemented as a variable resistance circuit configured to provide a variable resistance value based on the variation in temperature, the variable resistance circuit including a plurality of transistors arranged in series and controlled by a control voltage to provide the variable resistance value based on the variation in temperature.

7. A power amplifier comprising:
an input stage that includes an amplifying transistor having an input node and an output node, such that a signal at the input node has a first power level and an amplified signal at the output node has a second power level;
a bias circuit configured to provide a bias signal to the amplifying transistor;
a feedback circuit that couples the output node of the amplifying transistor to the input node of the amplifying transistor, the feedback circuit including a resistance and a capacitance arranged in series; and
a gain compensation circuit implemented along the feedback circuit to adjust a gain of the input stage based on the variation in temperature, the gain compensation circuit including the capacitance of the feedback circuit implemented as a variable capacitance circuit configured to provide a variable capacitance value based on the variation in temperature, the variable capacitance circuit including a diode capacitance circuit controlled by a control signal that depends on the variation in temperature.

8. The power amplifier of claim 7 wherein the variable capacitance circuit includes a plurality of diodes and controlled by a control voltage to provide the variable capacitance value based on the variation in temperature.

9. The power amplifier of claim 8 wherein the control voltage being provided to the variable capacitance circuit depends on the variation in temperature.

10. The power amplifier of claim 8 wherein the plurality of diodes includes a first diode and a second diode arranged such that an anode of the first diode is on an input side of the variable capacitance circuit, and anode of the second diode is on an output side of the variable capacitance circuit, and cathodes of the first and second diodes are coupled to each other, the control voltage being provided to a node between the cathodes of the first and second diodes.

11. A packaged module comprising:
a packaging substrate; and
a semiconductor die mounted on the packaging substrate and including a power amplifier, the power amplifier including an input stage that includes an amplifying transistor having an input node and an output node, such that a signal at the input node has a first power level and an amplified signal at the output node has a second power level, the power amplifier further including a feedback circuit that couples the output node of the amplifying transistor to the input node of the amplifying transistor, the feedback circuit including a resistance and a capacitance arranged in series, the power amplifier further including a gain compensation circuit implemented along an output path from the output node of the amplifying transistor, such that the gain compensation circuit adjusts the second power level based on a variation in temperature associated with the power amplifier.

12. A wireless device comprising:
a transceiver configured to generate a signal;
a power amplifier configured to amplify the signal, the power amplifier including an input stage that includes an amplifying transistor having an input node and an output node, such that a signal at the input node has a first power level and an amplified signal at the output node has a second power level, the power amplifier further including a feedback circuit that couples the output node of the amplifying transistor to the input node of the amplifying transistor, the feedback circuit including a resistance and a capacitance arranged in series, the power amplifier further including a gain compensation circuit implemented along an output path from the output node of the amplifying transistor, such that the gain compensation circuit adjusts the second power level based on a variation in temperature associated with the power amplifier; and an antenna in communication with the power amplifier and configured to support transmission of the amplified signal provided by the power amplifier.

* * * * *